US012588193B2

(12) United States Patent
Kwon et al.

(10) Patent No.: US 12,588,193 B2
(45) Date of Patent: Mar. 24, 2026

(54) SEMICONDUCTOR DEVICE AND METHOD OF FABRICATING THE SAME

(71) Applicant: SEMES CO., LTD., Chungcheongnam-do (KR)

(72) Inventors: Thomas Jongwan Kwon, Gyeonggi-do (KR); Yun Sang Kim, Gyeonggi-do (KR); Hae Won Choi, Daejeon (KR)

(73) Assignee: SEMES CO., LTD., Chungcheongnam-do (KR)

( * ) Notice: Subject to any disclaimer, the term of this patent is extended or adjusted under 35 U.S.C. 154(b) by 511 days.

(21) Appl. No.: 18/097,236

(22) Filed: Jan. 14, 2023

(65) Prior Publication Data

US 2024/0147705 A1     May 2, 2024

(30) Foreign Application Priority Data

Oct. 31, 2022     (KR) ........................ 10-2022-0143198

(51) Int. Cl.
*H10B 12/00*          (2023.01)

(52) U.S. Cl.
CPC ........... *H10B 12/488* (2023.02); *H10B 12/02* (2023.02); *H10B 12/482* (2023.02); *H10B 12/485* (2023.02)

(58) Field of Classification Search
CPC .... H10B 12/488; H10B 12/02; H10B 12/482; H10B 12/05; H10B 12/31; H10B 12/033; H10B 12/48; H10B 12/485
See application file for complete search history.

(56) References Cited

U.S. PATENT DOCUMENTS 7,355,230 B2 *   4/2008   Thies ................... H10B 12/053
                                                          257/302
10,784,272 B2   9/2020   Lee et al.
(Continued)

FOREIGN PATENT DOCUMENTS

KR     10-2019-0060251     6/2019
KR     10-2020-0039075     4/2020

OTHER PUBLICATIONS

Notice of Allowance dated Oct. 23, 2024 for Korean Patent Application No. 10-2022-0143198 and its English translation by Google Translate.

*Primary Examiner* — Yasser A Abdelaziez
(74) *Attorney, Agent, or Firm* — WOMBLE BOND DICKINSON (US) LLP

(57)          ABSTRACT

A semiconductor device including memory cells that are three-dimensionally arranged is provided. The semiconductor device includes: a stack structure including first and second layers, which are sequentially stacked on a substrate, the first layer including first and second semiconductor patterns, which are spaced apart from each other and extend in a first direction, and a first bitline, which extends in a second direction different from the first direction and is electrically connected to the first and second semiconductor patterns, the second layer including third and fourth semiconductor patterns, which are spaced apart from each other and extend in the first direction, and a second bitline, which extends in the second direction and is electrically connected to the third and fourth semiconductor patterns, and each of the first through fourth semiconductor patterns including a source, a channel, a drain, and a bottom electrode; a first wordline connecting the channels of the first and third semiconductor patterns in a vertical direction; a second (Continued)

wordline connecting the channels of the second and fourth semiconductor patterns in the vertical direction.

11 Claims, 32 Drawing Sheets

(56)                 References Cited

U.S. PATENT DOCUMENTS

| | | | |
|---|---|---|---|
| 11,100,958 B2 | 8/2021 | Kim et al. | |
| 11,355,509 B2 | 6/2022 | Lee et al. | |
| 11,844,212 B2 | 12/2023 | Lee et al. | |
| 2011/0221010 A1* | 9/2011 | Baek .................. | H10B 12/0335 |
| | | | 257/774 |
| 2019/0019722 A1* | 1/2019 | Sukekawa .......... | H10D 30/0323 |
| 2019/0206869 A1* | 7/2019 | Kim ....................... | H10B 12/20 |
| 2020/0066856 A1* | 2/2020 | Song ................. | H01L 21/76843 |
| 2020/0111793 A1* | 4/2020 | Kim ....................... | H10D 88/00 |
| 2021/0265357 A1* | 8/2021 | Varghese ........... | H10B 12/0335 |
| 2022/0367514 A1* | 11/2022 | Kim ....................... | H10B 51/20 |

* cited by examiner

FORM STACK STRUCTURE BY ALTERNATELY STACKING FIRST AND SECOND SEMICONDUCTOR LAYERS ON SUBSTRATE    ~S110

FORM WORDLINES TO PENETRATE STACK STRUCTURE    ~S120

FORM SELF-ALIGNED ISOLATION INSULATING FILM TO PENETRATE STACK STRUCTURE    ~S130

SEMICONDUCTOR DEVICE AND METHOD OF FABRICATING THE SAME

CROSS-REFERENCE TO RELATED APPLICATION

This application claims priority from Korean Patent Application No. 10-2022-0143198 filed on Oct. 31, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device and a method of fabricating the same.

2. Description of the Related Art

In the degree of integration of semiconductor memory devices including memory cells that are two-dimensionally arranged, planar areas that unit memory cells occupy may be main factors for deciding the degree of integration. Therefore, the degree of integration of the semiconductor memory devices may be largely affected by the level of a technology for forming fine patterns. The degree of integration of the semiconductor memory devices can be raised using ultra high-priced equipment, but there still is a limit in increasing the degree of integration of the semiconductor memory devices. Accordingly, semiconductor devices including memory cells that are three-dimensionally arranged have been proposed.

SUMMARY

Aspects of the present disclosure provide a semiconductor device including memory cells that are three-dimensionally arranged.

Aspects of the present disclosure also provide a method of fabricating a semiconductor device including memory cells that are three-dimensionally arranged.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor device includes: a stack structure including first and second layers, which are sequentially stacked on a substrate, the first layer including first and second semiconductor patterns, which are spaced apart from each other and extend in a first direction, and a first bitline, which extends in a second direction different from the first direction and is electrically connected to the first and second semiconductor patterns, the second layer including third and fourth semiconductor patterns, which are spaced apart from each other and extend in the first direction, and a second bitline, which extends in the second direction and is electrically connected to the third and fourth semiconductor patterns, and each of the first through fourth semiconductor patterns including a source, a channel, a drain, and a bottom electrode; a first wordline connecting the channels of the first and third semiconductor patterns in a vertical direction; a second wordline connecting the channels of the second and fourth semiconductor patterns in the vertical direction, wherein a first distance, in the first direction, between the first bitline and the first wordline differs from a second distance, in the first direction, between the first bitline and the second wordline.

According to another aspect of the present disclosure, a semiconductor device includes: a substrate including a capacitor region and first and second switching regions, which are disposed on both sides of the capacitor region; a stack structure including a plurality of layers, which are sequentially stacked on the substrate, each of the layers including a plurality of cell transistors, which are disposed in the first or second switching region and include first and second cell transistors, and a plurality of capacitors, which are disposed in the capacitor region and include first and second capacitors, the first cell transistor being electrically connected to the first capacitor and disposed in the first switching region, and the second cell transistor being electrically connected to the second capacitor and disposed in the second switching region; and a plurality of wordlines arranged vertically on the substrate and electrically connecting gates of the cell transistors.

According to another aspect of the present disclosure, a semiconductor device includes: a stack structure including first and second layers, which are sequentially stacked on a substrate, the first layer including first, second, and third semiconductor patterns, which are spaced apart from one another and extend in a first direction, a first bitline, which extends in a second direction different from the first direction and is electrically connected to the first and third semiconductor patterns, and a second bitline, which is electrically connected to the second semiconductor pattern, the second layer including fourth, fifth, and sixth semiconductor patterns, which are spaced apart from one another and extend in the first direction, a third bitline, which extends in the second direction and is electrically connected to the fourth and sixth semiconductor patterns, and a fourth bitline, which is electrically connected to the fifth semiconductor pattern, and each of the first through sixth semiconductor patterns including a source, a channel, a drain, and a bottom electrode; a first wordline connecting the channels of the first and fourth semiconductor patterns in a vertical direction; a second wordline connecting the channels of the second and fifth semiconductor patterns in the vertical direction; a third wordline connecting the channels of the third and sixth semiconductor patterns in the vertical direction; and an isolation insulating film disposed to extend in the vertical direction between the first and third wordlines, the isolation insulating film being in contact with the first and second wordlines and being self-aligned. A first distance, in the first direction, between the first bitline and the first wordline differs from a second distance, in the first direction, between the first bitline and the third wordline, and the isolation insulating film is formed to penetrate the second and fifth semiconductor patterns.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
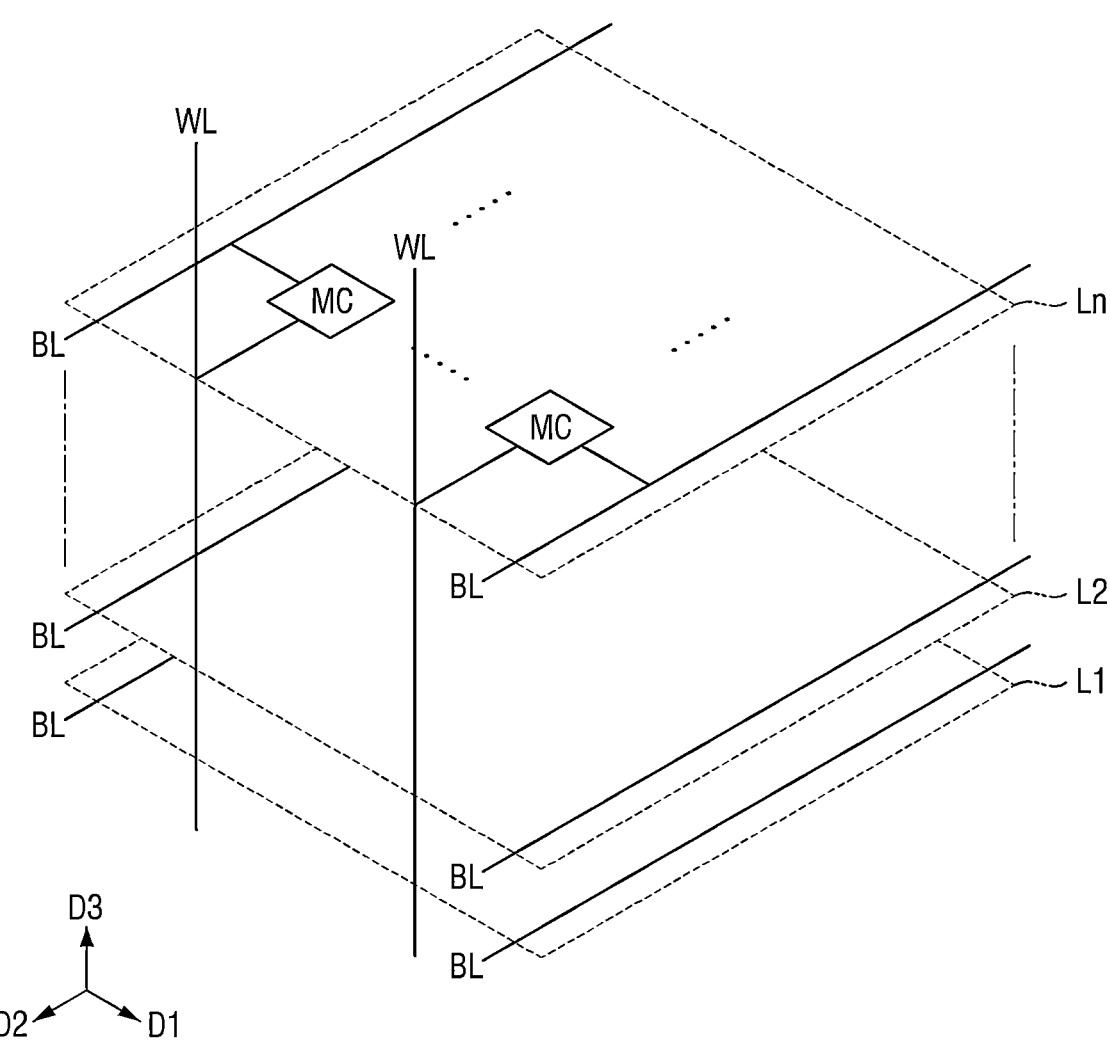
FIG. 1 is a schematic view of a semiconductor device according to some embodiments of the present disclosure.

Preferred embodiments of the present disclosure will be described in detail with reference to the accompanying drawings. The present disclosure and methods of accomplishing the same may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be through and complete and will fully convey the concept of the invention to those skilled in the art, and the present disclosure will only be defined by the appended claims. Like reference numbers designate like elements throughout the specification.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented, and, as such, the spatially relative descriptors used herein interpreted accordingly.

It will be understood that, although the terms "first", "second", etc. may be used herein to describe various elements, constituent elements and/or sections, the elements, constituent elements and/or sections should not be limited by these terms. These terms are only used to distinguish one element, constituent element, or section from another element, constituent element, or section. Thus, a first element, a first constituent element, or a first section discussed below should be termed a second element, a second constituent element, or a second section.

Exemplary embodiments of the present disclosure will hereinafter be described with reference to the accompanying drawings. Like reference numerals indicate like elements through the specification, and thus, detailed descriptions thereof will be omitted.

Figure 2:
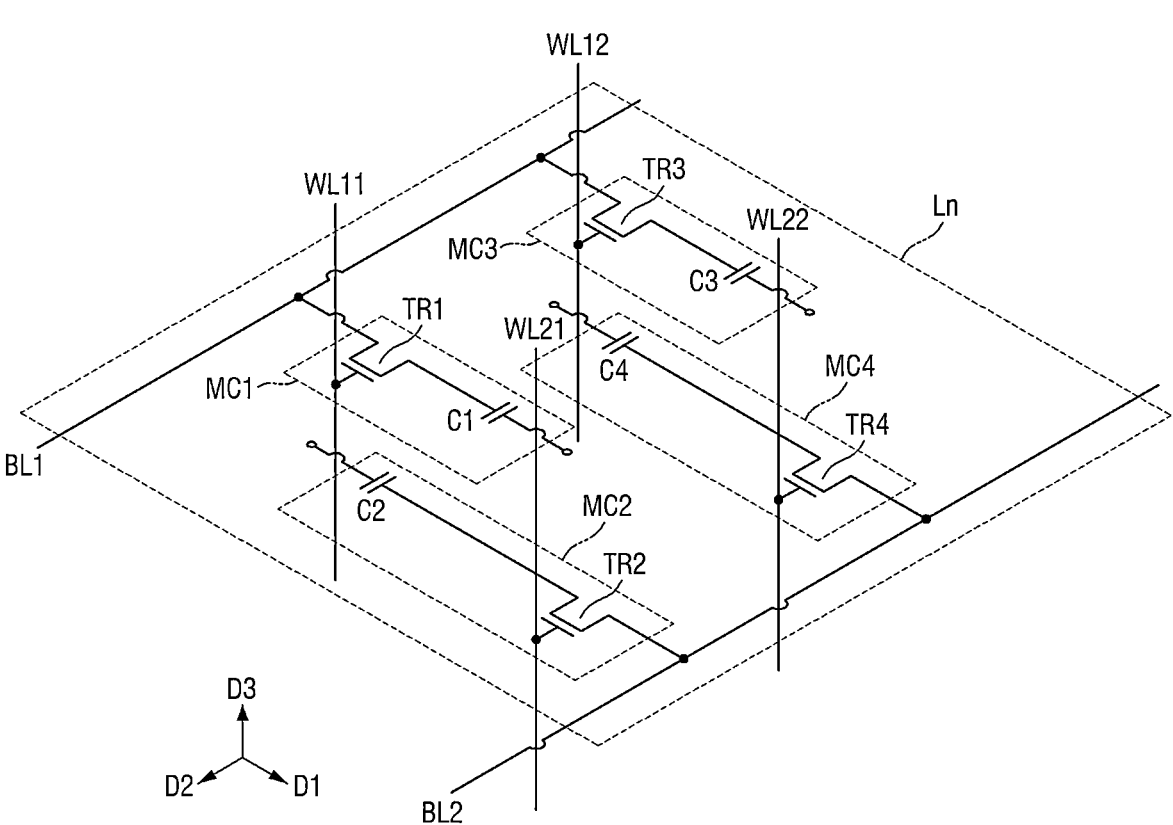
FIG. 2 is a circuit diagram of an n-th layer of FIG. 1.
Figure 3:
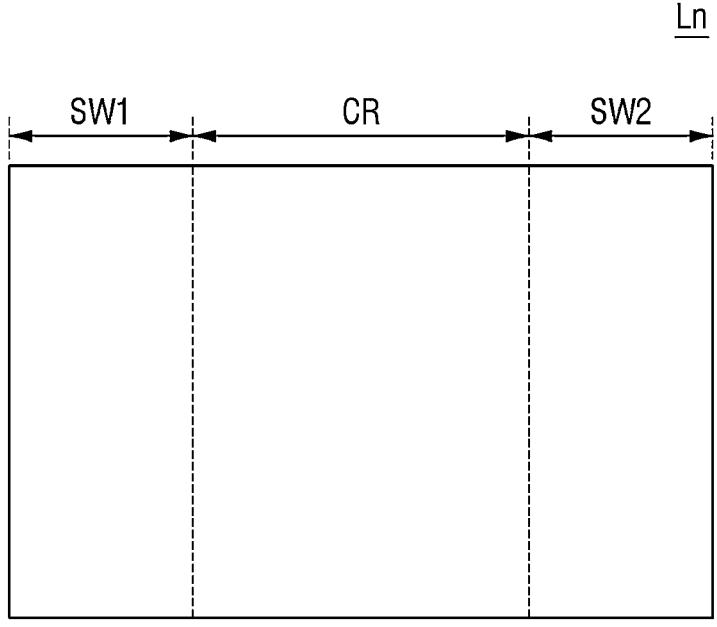
FIG. 3 illustrates regions included in the n-th layer Ln of FIG. 2.

FIG. 1 is a schematic view of a semiconductor device according to some embodiments of the present disclosure. FIG. 2 is a circuit diagram of an n-th layer of FIG. 1. FIG. 3 illustrates regions included in the n-th layer Ln of FIG. 2.

Referring to FIG. 1, the semiconductor device includes a plurality of layers, i.e., first through n-th layers L1 through Ln (where n is a natural number of 2 or greater), which are stacked. The first through n-th layers L1 through Ln are stacked in a third direction D3. A plurality of memory cells MC are two-dimensionally arranged in each of the first through n-th layers L1 through Ln. For example, the memory cells MC may be arranged in first and second directions D1 and D2. The memory cells MC include cell transistors and capacitors.

Bitlines BL may be installed in each of the first through n-th layers L1 through Ln, and wordlines WL may be installed to penetrate the first through n-th layers L1 through Ln. The bitlines BL may extend in the second direction D2, and the wordlines WL may extend in the third direction D3. The memory cells MC are electrically connected to the bitlines BL and the wordlines WL.

The first direction D1 may be parallel to the direction in which semiconductor patterns (or the bottom electrodes of capacitors) that will be described later extend, but the present disclosure is not limited thereto. The second direction D2 may be parallel to the direction in which the bitlines BL extend, but the present disclosure is not limited thereto. The third direction D3 may be parallel to a direction in which the wordlines WL extend, but the present disclosure is not limited thereto.

The structure of the n-th layer Ln will hereinafter be described with reference to FIG. 2. Referring to FIG. 2, bitlines BL1 and BL2 extend in the second direction D2 and are disposed to be spaced apart from each other.

Wordlines WL11, WL12, WL21, and WL22 are disposed to extend in the third direction D3.

A first memory cell MC1 is connected between the bitline BL1 and the wordline WL11. The source of the first memory cell MC1 is connected to the bitline BL1, the gate of the first memory cell MC1 is connected to the wordline WL11, and the drain of the first memory cell MC1 is connected to a capacitor C1.

A second memory cell MC2 is connected between the bitline BL2 and the wordline WL21. The source of the second memory cell MC2 is connected to the bitline BL2, the gate of the second memory cell MC2 is connected to the wordline WL21, and the drain of the second memory cell MC2 is connected to a capacitor C2.

A third memory cell MC3 is connected between the bitline BL1 and the wordline WL12. The source of the third memory cell MC3 is connected to the bitline BL1, the gate of the third memory cell MC3 is connected to the wordline WL12, and the drain of the third memory cell MC3 is connected to a capacitor C3.

A fourth memory cell MC4 is connected between the bitline BL2 and the wordline WL22. The source of the fourth memory cell MC4 is connected to the bitline BL2, the gate of the fourth memory cell MC4 is connected to the wordline WL22, and the drain of the fourth memory cell MC4 is connected to a capacitor C4.

Referring to FIG. 3, the n-th layer Ln (or a substrate where the n-th layer Ln is formed) may include a capacitor region CR and first and second switching regions SW1 and SW2, which are disposed on both sides of the capacitor region CR.

A plurality of capacitors, i.e., first through fourth capacitors C1 through C4, are disposed in the capacitor region CR.

Cell transistors, i.e., first through fourth transistors TR1 through TR4, are disposed in the first or second switching region SW1 or SW2.

The first through fourth cell transistors TR1 through TR4 may be disposed in a staggered (or zigzag) fashion. For example, the first cell transistor TR1, which corresponds to the first capacitor C1, may be disposed in the first switching region SW1, the second cell transistor TR2, which corresponds to the second capacitor C2 adjacent to the first capacitor C1, may be disposed in the second switching region SW2, the third cell transistor TR3, which corresponds to the third capacitor C3 adjacent to the second capacitor C2, may be disposed in the first switching region SW1, and the fourth cell transistor TR4, which corresponds to the fourth capacitor C4 adjacent to the third capacitor C3, may be disposed in the second switching region SW2.

Figure 4:
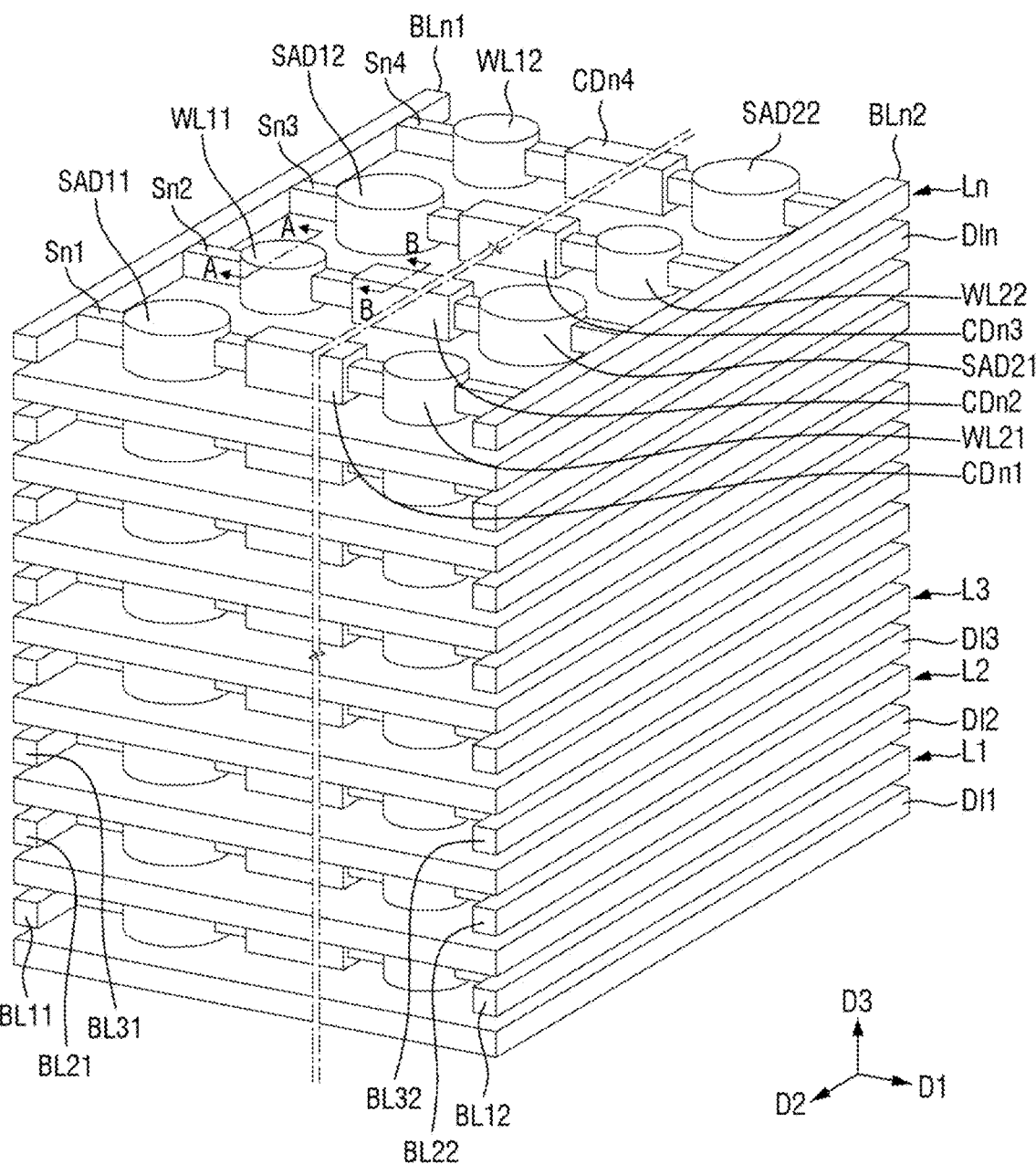
FIG. 4 is a perspective view of a semiconductor device according to some embodiments of the present disclosure.
Figure 5:
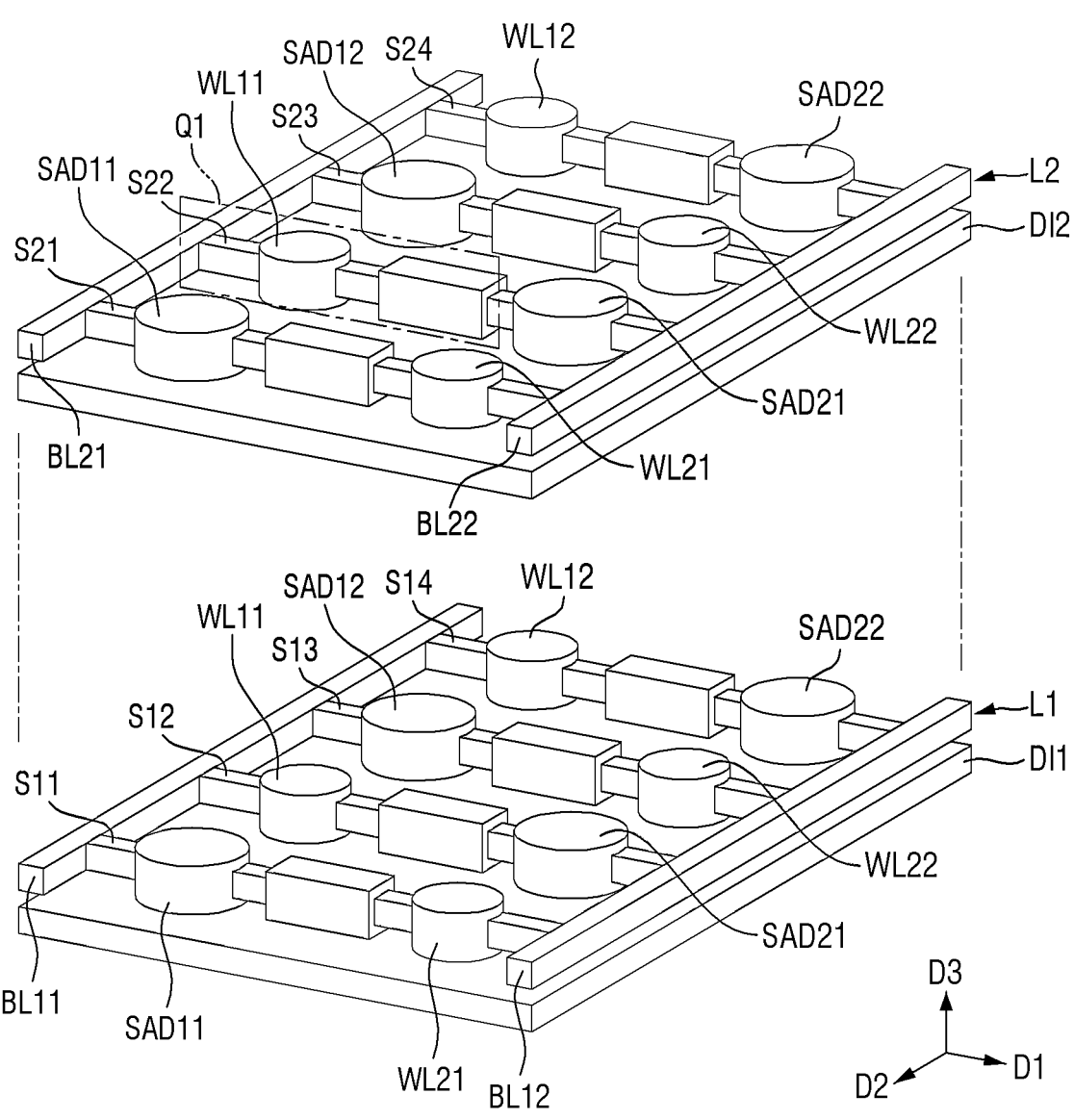
FIG. 5 is an enlarged perspective view illustrating first and second layers of FIG. 4.
Figure 6:
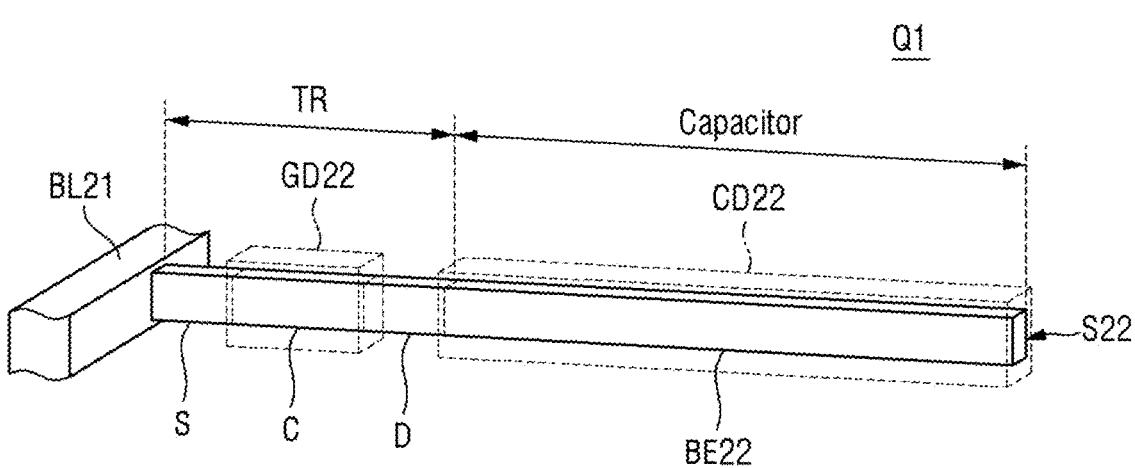
FIG. 6 is an enlarged perspective view of an area Q1 of FIG. 5.

FIG. 4 is a perspective view of a semiconductor device according to some embodiments of the present disclosure. FIG. 5 is an enlarged perspective view illustrating the first and second layers L1 and L2 of FIG. 4. FIG. 6 is an enlarged perspective view of an area Q1 of FIG. 5. For convenience, the top electrodes of capacitors are not illustrated in FIGS. 4 through 6.

Referring to FIG. 4, the semiconductor device includes a plurality of first through n-th layers L1 through Ln, which are stacked in a third direction D3, and interlayer insulating films DI1 through DIn are disposed between the first through n-th layers L1 through Ln.

Referring to FIGS. 4 and 5, the first layer L1 includes a plurality of semiconductor patterns S11, S12, S13, and S14, which are spaced apart from one another and extend in a first direction D1. The layer L1 also includes bitlines BL11 and BL12, which are spaced apart from each other and extend in a second direction D2.

The second layer L2 includes a plurality of semiconductor patterns S21, S22, S23, and S24, which are spaced apart from one another and extend in the first direction D1. The second layer L2 also includes bitlines BL21 and BL22, which are spaced apart from each other and extend in the second direction D2.

The layer Ln includes a plurality of semiconductor patterns Sn1, Sn2, Sn3, and Sn4, which are spaced apart from one another and extend in the first direction D1. The layer Ln also includes bitlines BLn1 and BLn2, which are spaced apart from each other and extend in the second direction D2.

Referring to FIG. 6, the semiconductor pattern S22, for example, may be divided into a source S, a channel C, a drain D, and a bottom electrode BE22. The semiconductor pattern S22 may include, for example, silicon (Si), but the present disclosure is not limited thereto. The source S, the drain D, and the bottom electrode BE22 may be, for example, impurity regions doped with n-type impurities.

A capacitor insulating film CD22 is formed to surround the bottom electrode BE22. The capacitor insulating film CD22 may be formed to surround the four sides of the bottom electrode BE22. The capacitor insulating film CD22 may include, for example, a high-k material, but the present disclosure is not limited thereto.

A gate insulating film GD22 is formed to surround the channel C. The gate insulating film GD22 may be formed to surround the four sides of the channel C. The gate insulating film GD22 may include, for example, at least one of an oxide film, a nitride film, and a high-k material, but the present disclosure is not limited thereto.

Referring again to FIGS. 4 and 5, channels C of the first through n-th layers L1 through Ln, which are stacked in the third direction D3, may be electrically connected by the wordlines WL11, WL12, WL21, and WL22, but the present disclosure is not limited thereto.

Specifically, the wordline WL11 electrically connects the channels C of the semiconductor patterns S12, S22, ..., and Sn2 in a vertical direction, the wordline WL12 electrically connects the channels C of the semiconductor patterns S14, S24, ..., Sn4 in the vertical direction, the wordline WL21 electrically connects the channels C of the semiconductor patterns S11, S21, ..., Sn1 in the vertical direction, and the wordline WL22 electrically connects the channels C of the semiconductor patterns S13, S23, ..., Sn3 in the vertical direction.

Isolation insulating films SAD11, SAD12, SAD21, and SAD22 are formed to penetrate the first through n-th layers L1 through Ln, which are stacked in the third direction D3. The isolation insulating films SAD11, SAD12, SAD21, and SAD22 are disposed between the wordlines WL11, WL12, WL21, and WL22 to insulate the wordlines WL11, WL12, WL21, and WL22 from one another.

Specifically, the isolation insulating film SAD12 is disposed between the wordlines WL11 and WL12 in the second direction D2, and the isolation insulating film SAD21 is disposed between the wordlines WL21 and WL22 in the second direction D2.

A source S, a channel C, and a drain D (of a cell transistor) may be positioned on one side, in the first direction D1, of the bottom electrode BEn2 of the semiconductor pattern Sn2, and the isolation insulating film SAD21 may be positioned on the other side, in the first direction D1, of the bottom electrode BEn2. Accordingly, one side of the semiconductor pattern Sn2 may be electrically connected to, for example, the bitline BLn1, and the other side of the semiconductor pattern SN2 may be insulated from, for example, the bitline BLn2, by the isolation insulating film SAD21.

As illustrated in FIGS. 4 and 5, the wordlines WL11, WL12, WL21, and WL22 may be disposed in a staggered (or zigzag) fashion.

The wordlines WL11, WL12, WL21, and WL22 are not installed in one switching region (e.g., the first switching region SW1 of FIG. 3). The wordlines WL11 and WL12 are disposed in the first switching region SW1, and the wordlines WL21 and WL22 are disposed in the second switching region SW2. The wordlines WL11 and WL12, which are connected to the semiconductor patterns Sn2 and Sn4, respectively, are disposed in the first switching region SW1, and the wordlines WL21 and WL22, which are connected to the semiconductor patterns Sn1 and Sn3, respectively, are disposed in the second switching region SW2.

The isolation insulating film SAD11, the wordline WL11, the isolation insulating film SAD12, and the wordline WL12 are sequentially disposed in the second direction D2 in the first switching region SW1. The wordline WL21, the isolation insulating film SAD21, the wordline WL22, and the isolation insulating film SAD22 are sequentially disposed in the second direction D2 in the second switching region SW2.

Referring to FIG. 4, CDn1 through CDn4 refer to capacitor insulating films formed in the semiconductor patterns Sn1, Sn2, Sn3, and Sn4 in the n-ty layer Ln.

Figure 7:
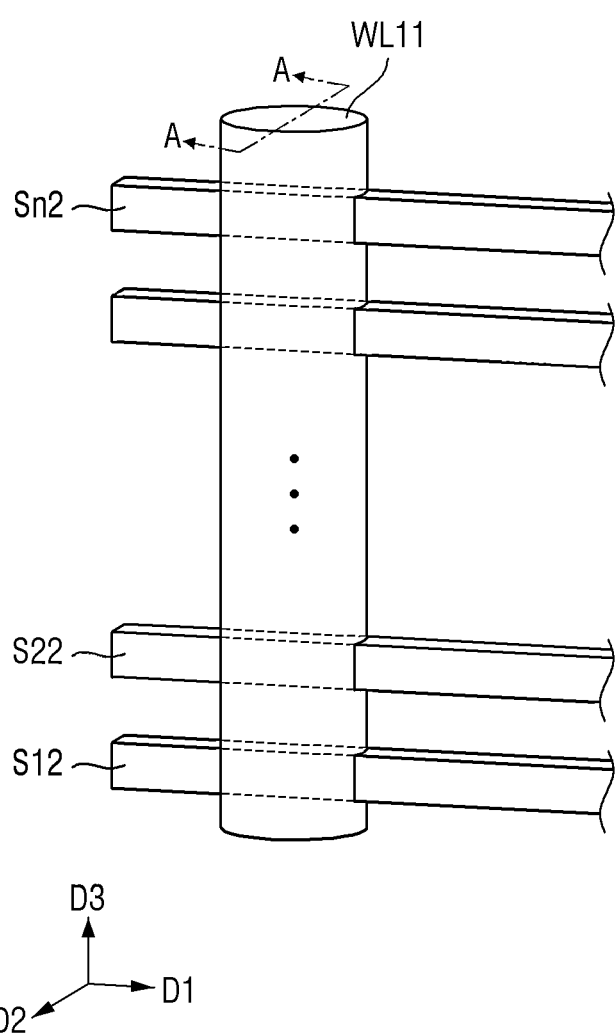
FIG. 7 illustrates a wordline of FIG. 4.
Figure 8:
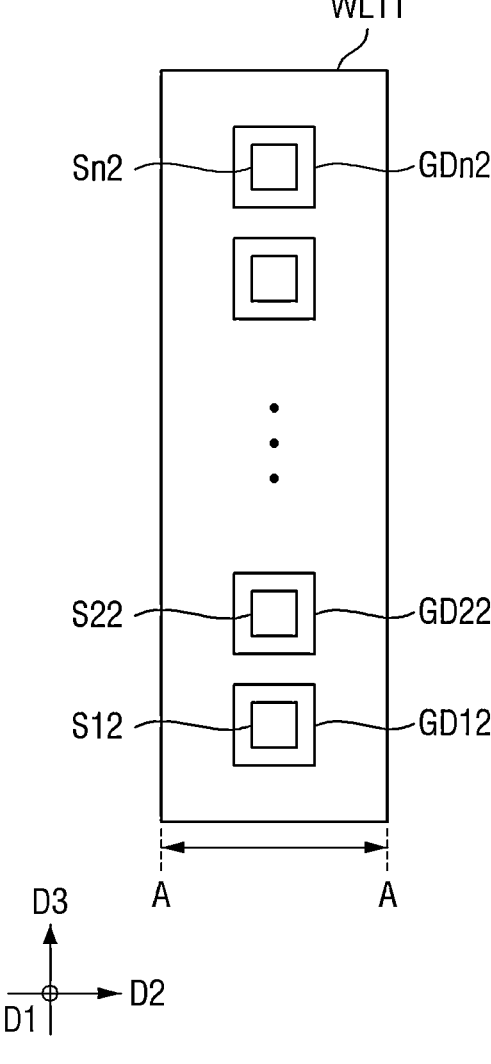
FIG. 8 is a cross-sectional view taken along line A-A of FIG. 4 or 7.
Figure 9:
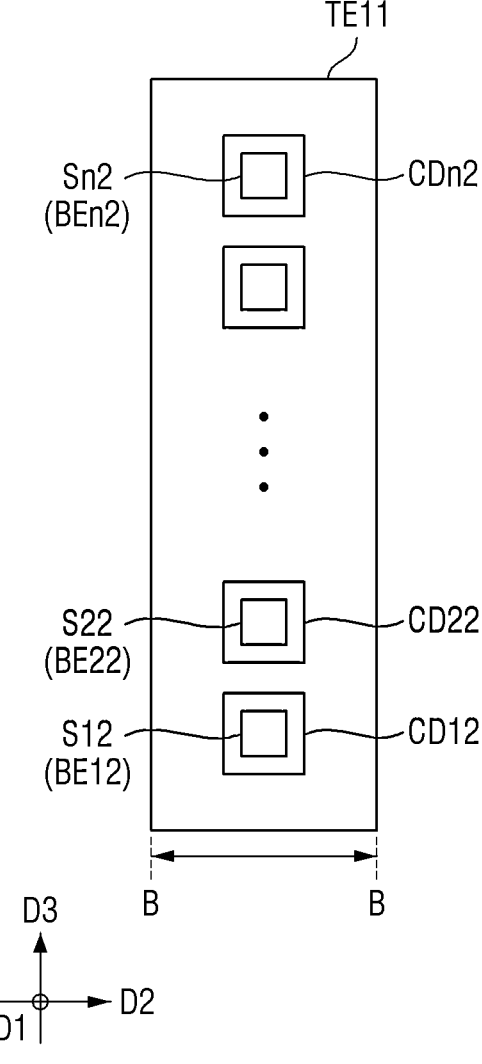
FIG. 9 illustrates a top electrode of FIG. 4.

FIG. 7 illustrates the wordline WL11 of FIG. 4. FIG. 8 is a cross-sectional view taken along line A-A of FIG. 4 or 7. FIG. 9 illustrates a top electrode TE11 of FIG. 4.

Referring to FIGS. 7 and 8, the semiconductor patterns S12, S22, . . . , and Sn2 are stacked in the third direction D3. Gate insulating films GD12, GD22, . . . , and GDn2 are formed to surround parts of the semiconductor patterns S12, S22, . . . , and Sn2 (i.e., the channels C of the semiconductor patterns S12, S22, . . . , and Sn2). The gate insulating films GD12, GD22, . . . , and GDn2 are formed to surround the four sides of their respective channels C. The wordline WL11 extends in the third direction D3 and is formed to surround the semiconductor patterns S12, S22, . . . , and Sn2.

Referring to FIG. 9, the semiconductor patterns S12, S22, . . . , and Sn2 are stacked in the third direction D3. Capacitor insulating films CD12, CD22, . . . , and CDn2 are formed to surround the semiconductor patterns S12, S22, . . . , and Sn2 (i.e., the bottom electrodes BE12, BE22, . . . , and BEn2), respectively. The capacitor insulating films CD12, CD22, . . . , and CDn2 are formed to surround the four sides of their respective bottom electrodes BE12, BE22, . . . , and BEn2. The top electrode TE11 extends in the third direction D3 and is formed to surround the semiconductor patterns S12, S22, . . . , and Sn2 (i.e., the bottom electrodes BE12, BE22, . . . , and BEn2).

Figure 10:
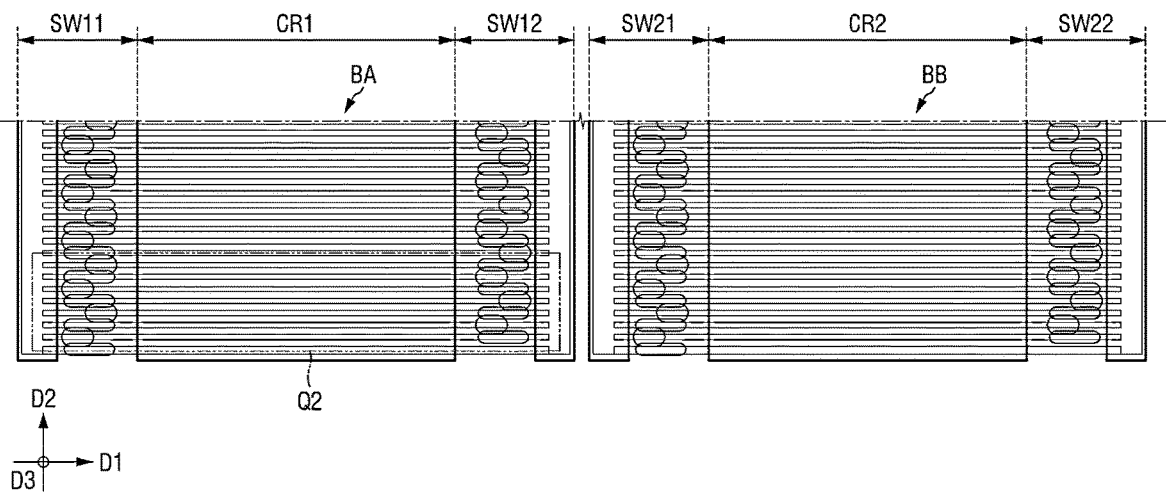
FIG. 10 is a layout view of a semiconductor device according to some embodiments of the present disclosure.
Figure 11:
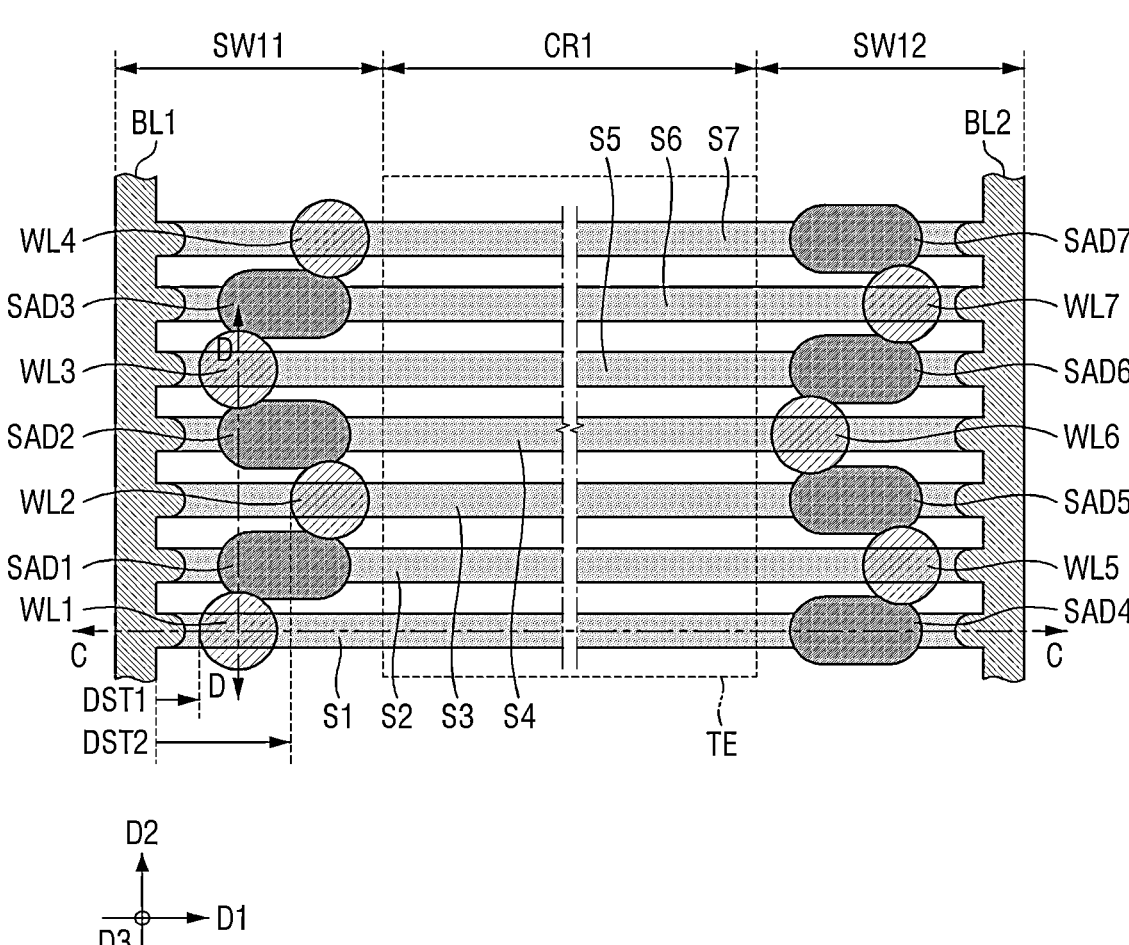
FIG. 11 is an enlarged layout view of an area Q2 of FIG. 10.
Figure 12:
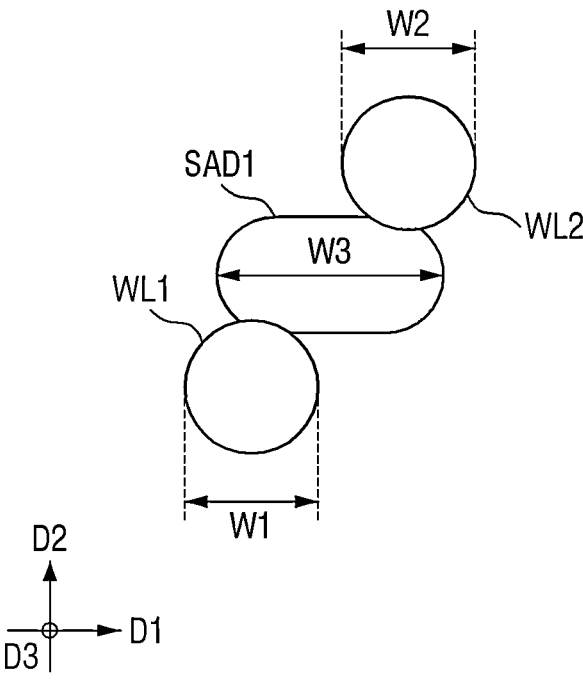
FIG. 12 illustrates the relationship between an isolation insulating film and wordlines.
Figure 13:
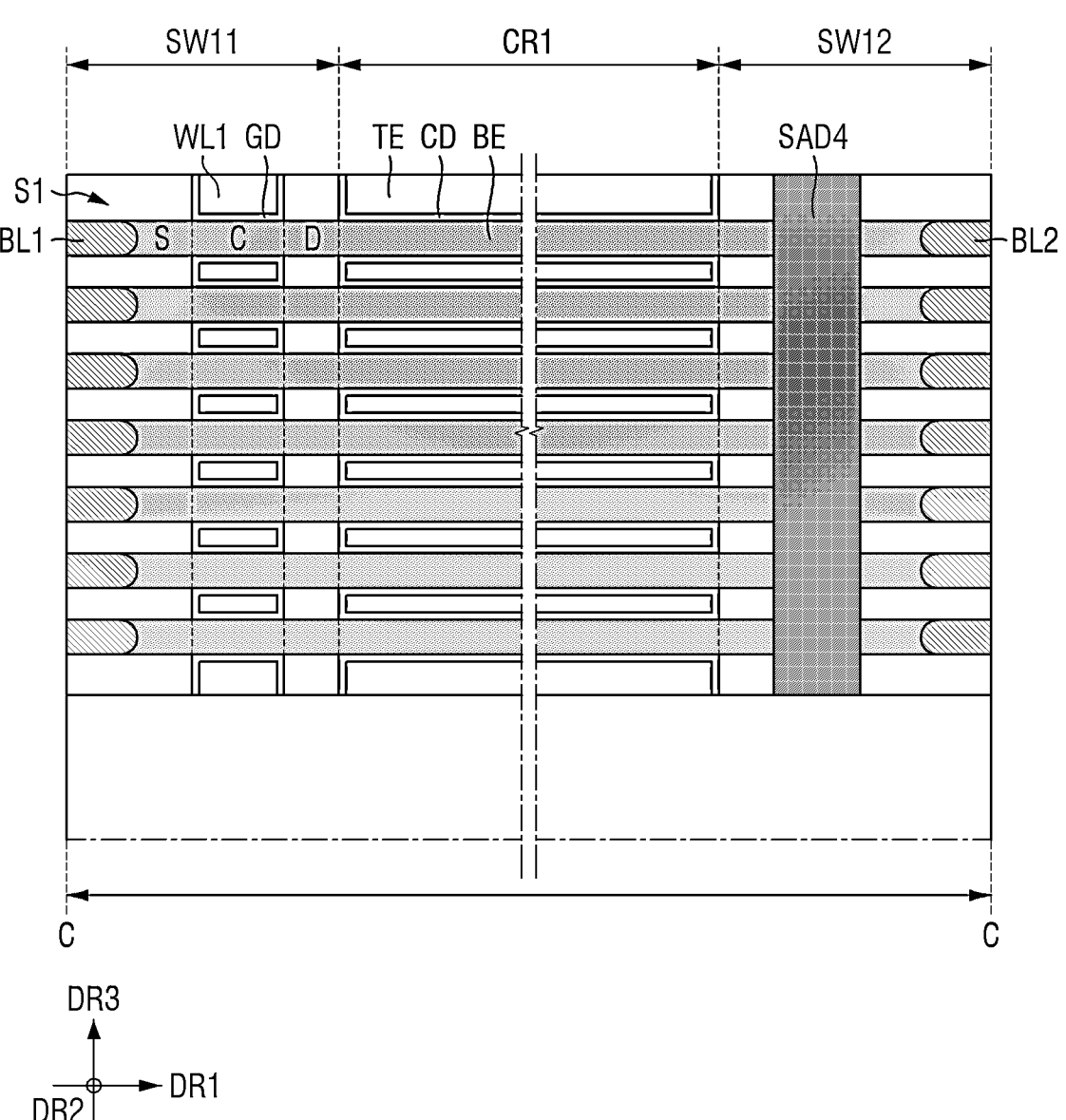
FIG. 13 is a cross-sectional view taken along line C-C of FIG. 11.
Figure 14:
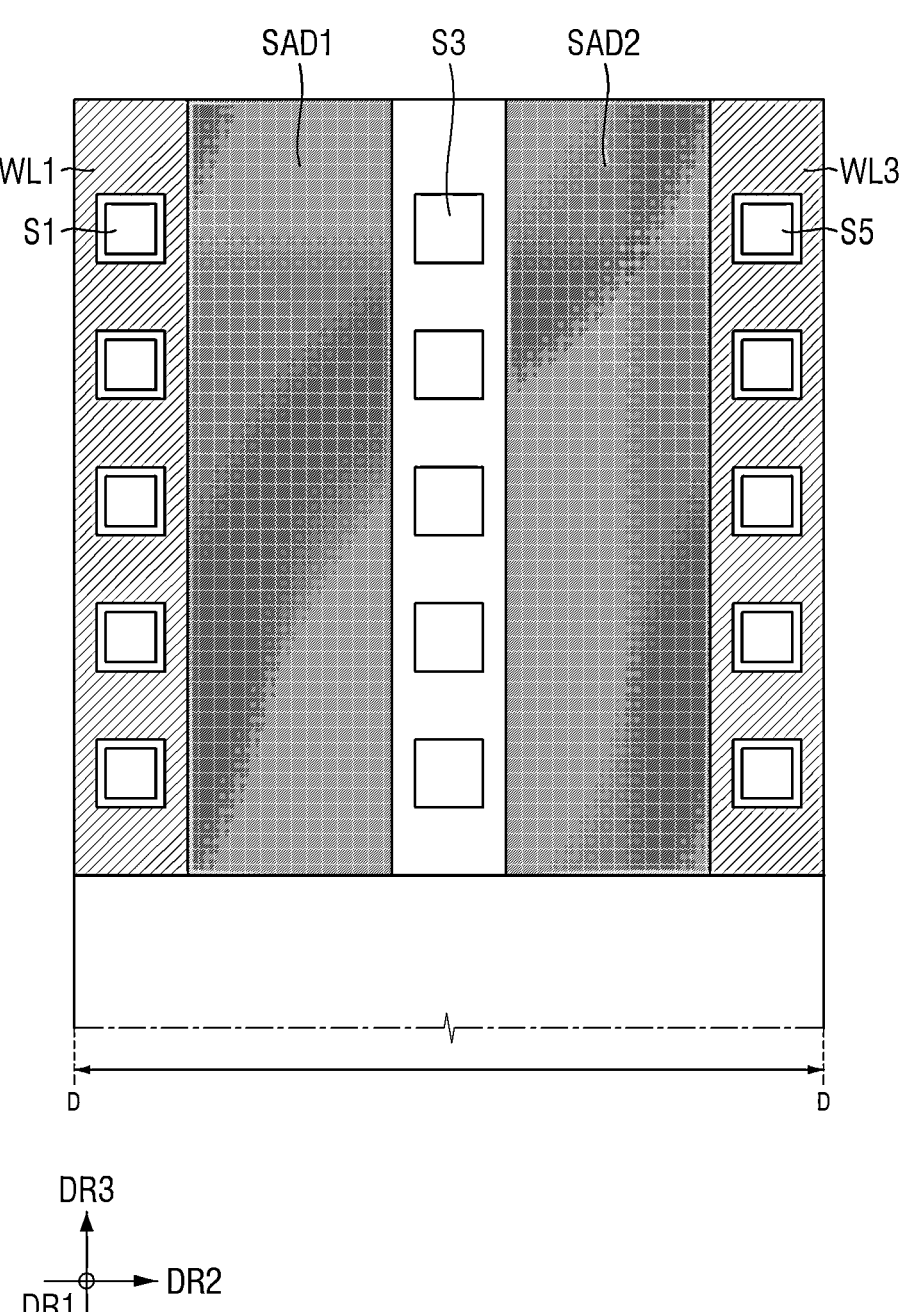
FIG. 14 is a cross-sectional view taken along line D-D of FIG. 11.

FIG. 10 is a layout view of a semiconductor device according to some embodiments of the present disclosure. FIG. 11 is an enlarged layout view of an area Q2 of FIG. 10. FIG. 12 illustrates the relationship between an isolation insulating film and wordlines. FIG. 13 is a cross-sectional view taken along line C-C of FIG. 11. FIG. 14 is a cross-sectional view taken along line D-D of FIG. 11.

Referring to FIG. 10, the semiconductor device includes a plurality of banks, i.e., first and second banks BA and BB. The first and second banks BA and BB are illustrated as being disposed in parallel in a first direction D1, but the present disclosure is not limited thereto.

The first bank BA includes a capacitor region CR1 and first and second switching regions SW11 and SW12, which are disposed on both sides of the capacitor region CR1. Similarly, the second bank BB includes a capacitor region CR2 and first and second switching regions SW21 and SW22, which are disposed on both sides of the capacitor region CR2.

Referring to FIG. 11, a plurality of semiconductor patterns S1 through S7 are disposed in the first bank BA to extend in the first direction D1. The semiconductor patterns S1 through S7 are spaced apart from one another in a second direction D2.

Wordlines WL1, WL2, WL3, and WL4, which are electrically connected to the channels of the semiconductor patterns S1, S3, S5, and S7, respectively, and extend in a third direction D3, are disposed in the first switching region SW11. Isolation insulating films SAD1, SAD2, and SAD3, which extend in the third direction D3, are disposed to penetrate the semiconductor patterns S2, S4, and S6, respectively.

The wordlines WL1 through WL4 may be disposed in a staggered (or zigzag) fashion in the first switching region SW11.

In other words, a first distance DST1, in the first direction D1, between a bitline BL1 and the wordline WL1 or WL3 may differ from a second distance DST2, in the first direction D1, between the bitline BL1 and the wordline WL2 or WL4.

An imaginary line connecting the centers of the wordlines WL1 and WL3 does not overlap with the wordline WL2 because the wordline WL2 is disposed closer than the wordlines WL1 and WL3 to the capacitor region CR1.

The isolation insulating films SAD1 through SAD3 are disposed between the wordlines WL1 through WL4. For example, the isolation insulating film SAD1 prevents a pair of adjacent wordlines in the second direction D2, i.e., the wordlines WL1 and WL2, from being short-circuited. The isolation insulating film SAD1 may be self-aligned while being in contact with the wordlines WL1 and WL2. As will be described later, the isolation insulating film SAD1 is formed by forming a trench to have a low etch rate for the material of the wordlines WL1 and WL2 (i.e., a metal) and filling the trench with an insulating film. As the isolation insulating film SAD1 is self-aligned, the isolation insulating film SAD1 can properly insulate the wordlines WL1 and WL2, which are adjacent to each other, even in a narrow region.

Referring to FIG. 12, a width W3, in the first direction D1, of the isolation insulating film SAD1 is greater than a width W1, in the first direction D1, of the wordline WL1 or a width W2, in the first direction D1, of the wordline WL2. As the wordlines WL1 and WL2 are disposed in a staggered manner, the isolation insulating film SAD1 is formed to extend long in the first direction D1 to properly insulate the wordlines WL1 and WL2.

Referring again to FIG. 11, isolation insulating films SAD4, SAD5, SAD6, and SAD7, which extend in the third direction D3, are disposed in the second switching region SW12 to penetrate the semiconductor patterns S1, S3, S5, and S7, respectively. Also, wordlines WL5, WL6, and WL7, which are electrically connected to the channels C of the semiconductor patterns S2, S4, and S6 and extend in the third direction D3, are disposed in the second switching region SW12.

The wordlines WL5, WL6, and WL7 may be disposed in a staggered (or zigzag) fashion in the second switching region SW12.

In other words, the distance, in the first direction D1, between a bitline BL2 and the wordline WL5 or WL7 may differ from the distance, in the first direction D1, between the bitline BL2 and the wordline WL6.

An imaginary line connecting the centers of the wordlines WL5 and WL7 does not overlap with the wordline WL6 because the wordline WL6 is disposed closer than the wordlines WL5 and WL7 to the capacitor region CR1.

A capacitor insulating film is formed in the capacitor region CR1 to surround the semiconductor patterns S1 through S7, and the top electrode TE is formed on the capacitor insulating film.

Referring to FIG. 13, a plurality of semiconductor patterns S1 may be disposed to extend in the first direction D1 across the first switching region SW11, the capacitor region CR1, and the second switching region SW12. The semiconductor patterns S1 are stacked in the third direction D3.

Bitlines BL1, which are connected to first sides of the semiconductor patterns S1, is disposed in the first switching region SW11. Bitlines BL2, which are connected to second sides of the semiconductor patterns S1, is disposed in the second switching region SW12. The semiconductor patterns S1 are electrically isolated from one another by the isolation insulating film SAD4. Thus, the semiconductor patterns S1 may receive voltages and/or signals from the bitlines BL1, but not from the bitlines BL2.

The semiconductor patterns S1 may be used as sources S, channels C, and drains D of cell transistors and as bottom electrodes BE of capacitors. Gate insulating films GD are formed to surround the channels C, and capacitor insulating films CD are formed to surround the bottom electrodes BE. A top electrode TE, which surrounds the bottom electrodes BE and the capacitor insulating films CD and extends in the third direction D3, is formed.

Referring to FIG. 14, semiconductor patterns S1 are disposed on a substrate to be stacked in the third direction D3, semiconductor patterns S3 are disposed on the substrate to be stacked in the third direction D3, and semiconductor patterns S5 are disposed on the substrate to be stacked in the third direction D3.

The semiconductor patterns S1, the semiconductor patterns S3, and the semiconductor patterns S5 are spaced apart from one another in the second direction D2.

The semiconductor patterns S1, which are stacked, are electrically connected by the wordline WL1, and the semiconductor patterns S5, which are stacked, are electrically connected by the wordline WL3. The semiconductor patterns S3, which are stacked, are surrounded by an insulating film.

The isolation insulating film SAD1 is disposed between the semiconductor patterns S1 and the semiconductor patterns S3, which are adjacent to the semiconductor patterns S1. The isolation insulating film SAD2 is disposed between the semiconductor patterns S3 and the semiconductor patterns S5, which are adjacent to the semiconductor patterns S3.

Figure 15:
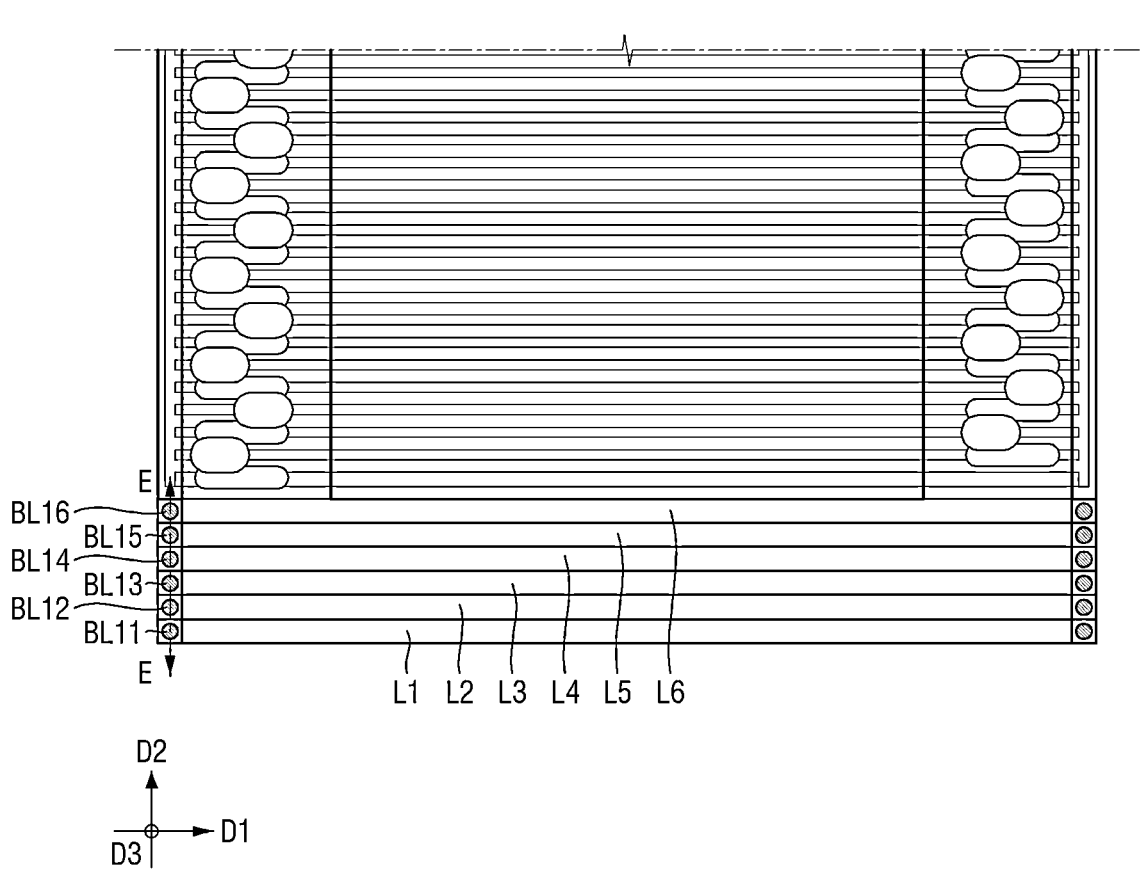
FIG. 15 is a layout view illustrating how bitlines and bitline contacts are connected in a semiconductor device according to some embodiments of the present disclosure.
Figure 16:
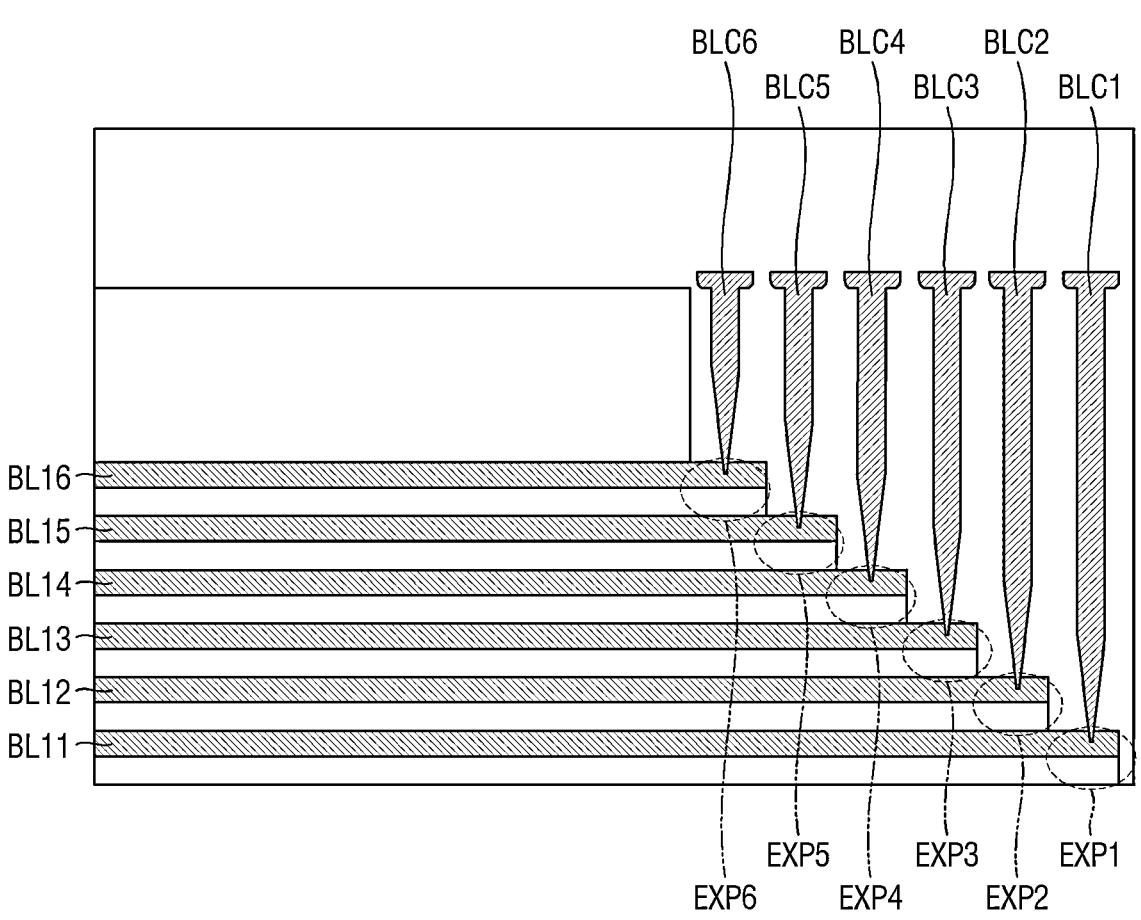
FIG. 16 is a cross-sectional view taken along line E-E of FIG. 15.

FIG. 15 is a layout view illustrating how bitlines and bitline contacts are connected in a semiconductor device according to some embodiments of the present disclosure. FIG. 16 is a cross-sectional view taken along line E-E of FIG. 15.

Referring to FIGS. 15 and 16, the semiconductor device includes a plurality of layers L1 through L6, which are stacked. Sides of the layers L1 through L6 may form a stepwise structure. That is, each of the layers L1 through L6 may be smaller in size than its overlying layer. For example, the second layer L2 may be smaller in size than the first layer L1. Thus, the first layer L1 may include an exposed region EXP1, which is exposed by the second layer L2. A bitline BL11 of the first layer L1 is also exposed by the second layer L2. Similarly, the layers L2, L3, L4, L5, and L6 may include exposed regions EXP2, EXP3, EXP4, EXP5, and EXP6, respectively. Bitlines BL12, BL13, BL14, and BL14 of the layers L2, L3, L4, and L5 are exposed by the layers L3, L4, L5, and L6, respectively. Bitline contacts BLC1, BLC2, BLC3, BLC4, BLC5, and BLC6, which are for providing signals to the bitlines BL11, BL12, BL13, BL14, and BL15 and a bitline BL16, respectively, are formed in the exposed regions EXP1, EXP2, EXP3, EXP4, EXP5, and EXP6, respectively.

Figure 17:
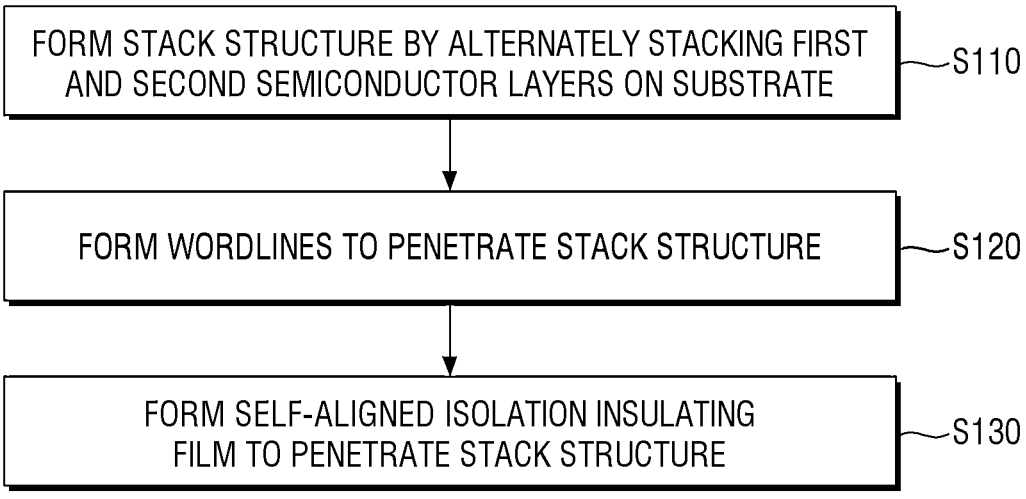
FIG. 17 is a flowchart illustrating a method of fabricating a semiconductor device according to some embodiments of the present disclosure.

FIG. 17 is a flowchart illustrating a method of fabricating a semiconductor device according to some embodiments of the present disclosure. FIGS. 18 through 27 are cross-sectional views illustrating intermediate steps of the method of FIG. 17. FIG. 17 is a flowchart illustrating how to form the wordlines WL1 and WL2 and the isolation insulating films SAD1 and SAD2 of FIG. 14 in a first switching region SW11.

Figure 18:
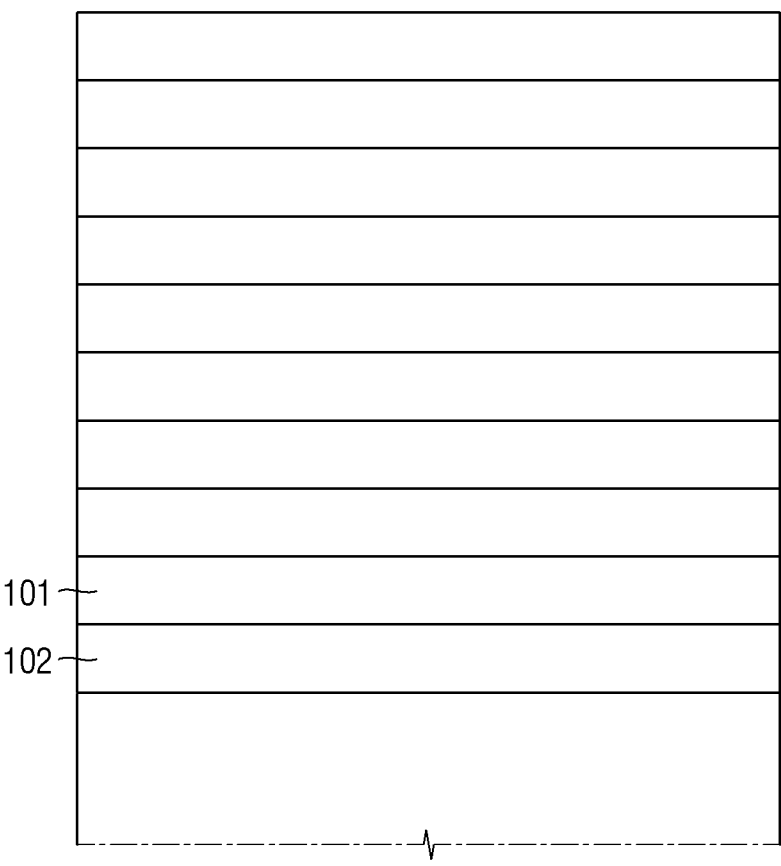
FIGS. 18 through 27 are cross-sectional views illustrating intermediate steps of the method of FIG. 17.

Referring to FIGS. 17 and 18, a stack structure is formed by alternately depositing first semiconductor (e.g., Si) layers 101 and second semiconductor (e.g., SiGe) layers 102 on a substrate (S110).

Thereafter, referring to FIG. 17, wordlines, which penetrate the stack structure, are formed (S120).

Figure 19:
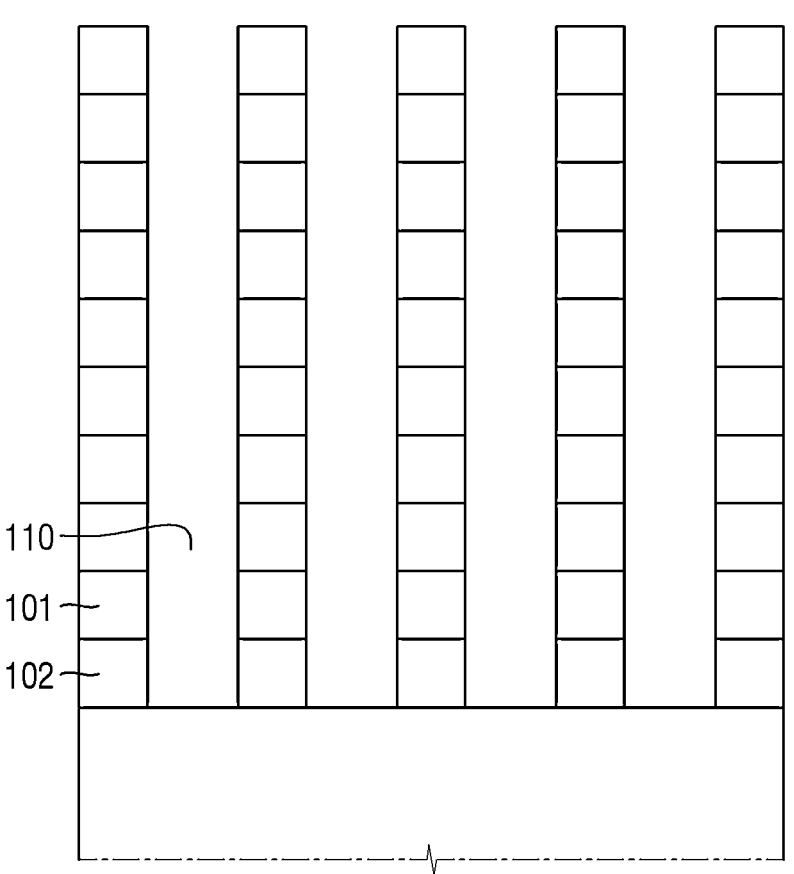

Specifically, referring to FIG. 19, a plurality of trenches 110 are formed in a switching region (e.g., the first switching region SW11 of FIG. 14) by patterning the stack structure.

Figure 20:
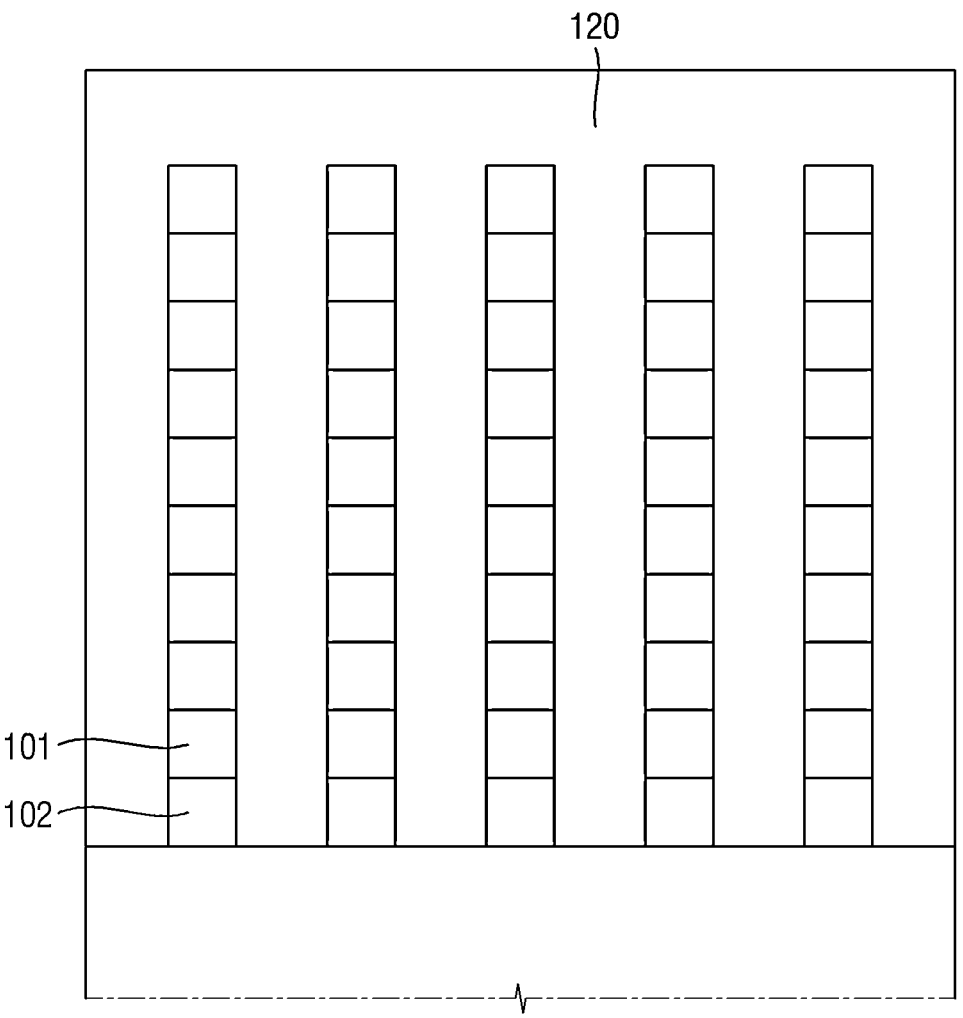

Thereafter, referring to FIG. 20, an insulating film 120 is formed to fill the trenches 110. The insulating film 120 may include at least one of an oxide film, a nitride film, and an oxynitride film. For example, the insulating film 120 may be an oxide film including a spin-on-dielectric (SOD) material with excellent gap-fill characteristics. The insulating film 120 may be formed by applying an insulating material onto the substrate through spinning and performing planarization (e.g., chemical mechanical planarization (CMP)).

Figure 21:
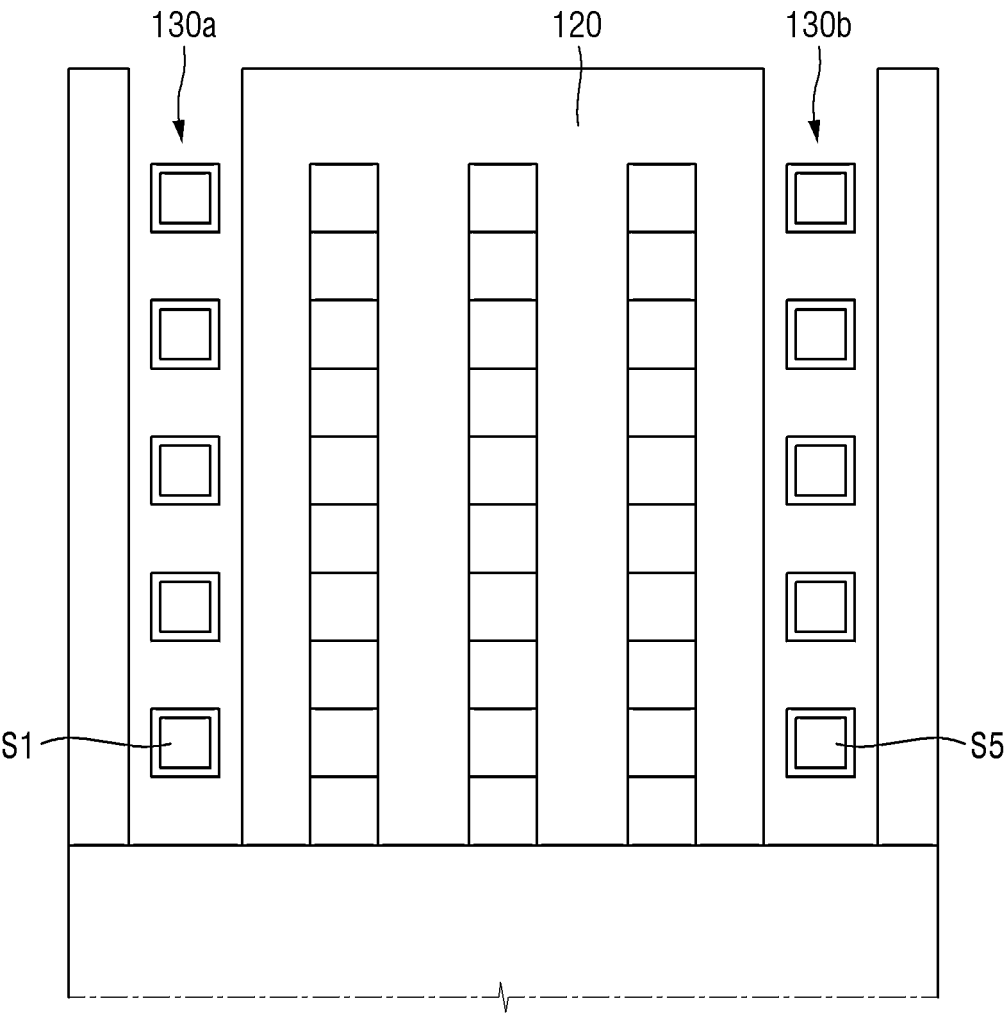

Thereafter, referring to FIG. 21, wordline forming regions 130a and 130b are formed. A stack of semiconductor patterns S1 is positioned in the wordline forming region 130a, and a stack of semiconductor patterns S5 is positioned in the wordline forming region 130b. The insulating film 120 is removed first from the wordline forming regions 130a and 130b, and the second semiconductor layers 102 are removed from the wordline forming regions 130a and 130b. The first semiconductor layers 101 are exposed in the wordline forming regions 130a and 130b. A gate insulating film is formed to surround the exposed first semiconductor layers 101.

The first semiconductor layers 101 in the wordline forming region 130a correspond to the semiconductor patterns S1 of FIG. 14. The first semiconductor layers 101 in the wordline forming region 130b correspond to the semiconductor patterns S5 of FIG. 14.

Figure 22:
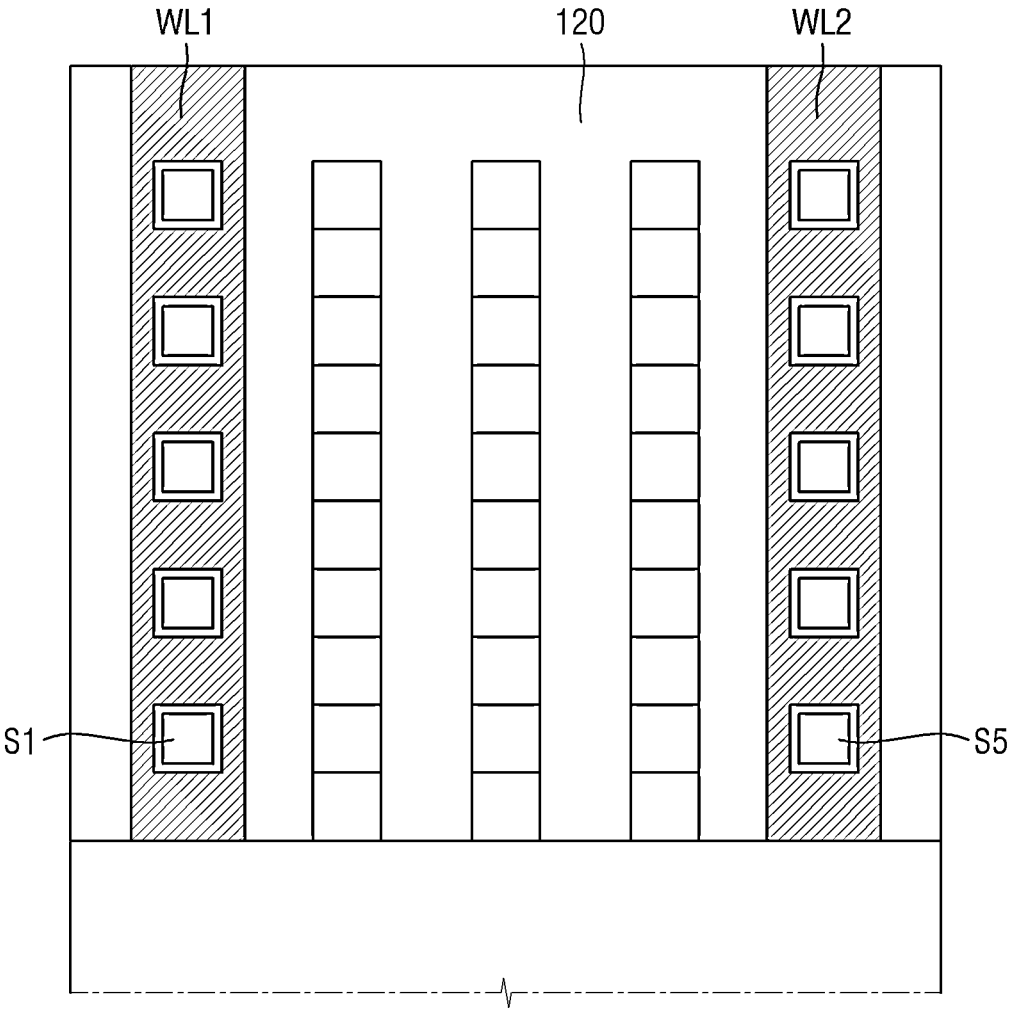

Thereafter, referring to FIG. 22, wordlines WL1 and WL2 are formed by filling the wordline forming regions 130a and 130b with a metal.

Referring again to FIG. 17, isolation insulating films, which penetrate the stack structure and are self-aligned, are formed (S130).

Figure 23:
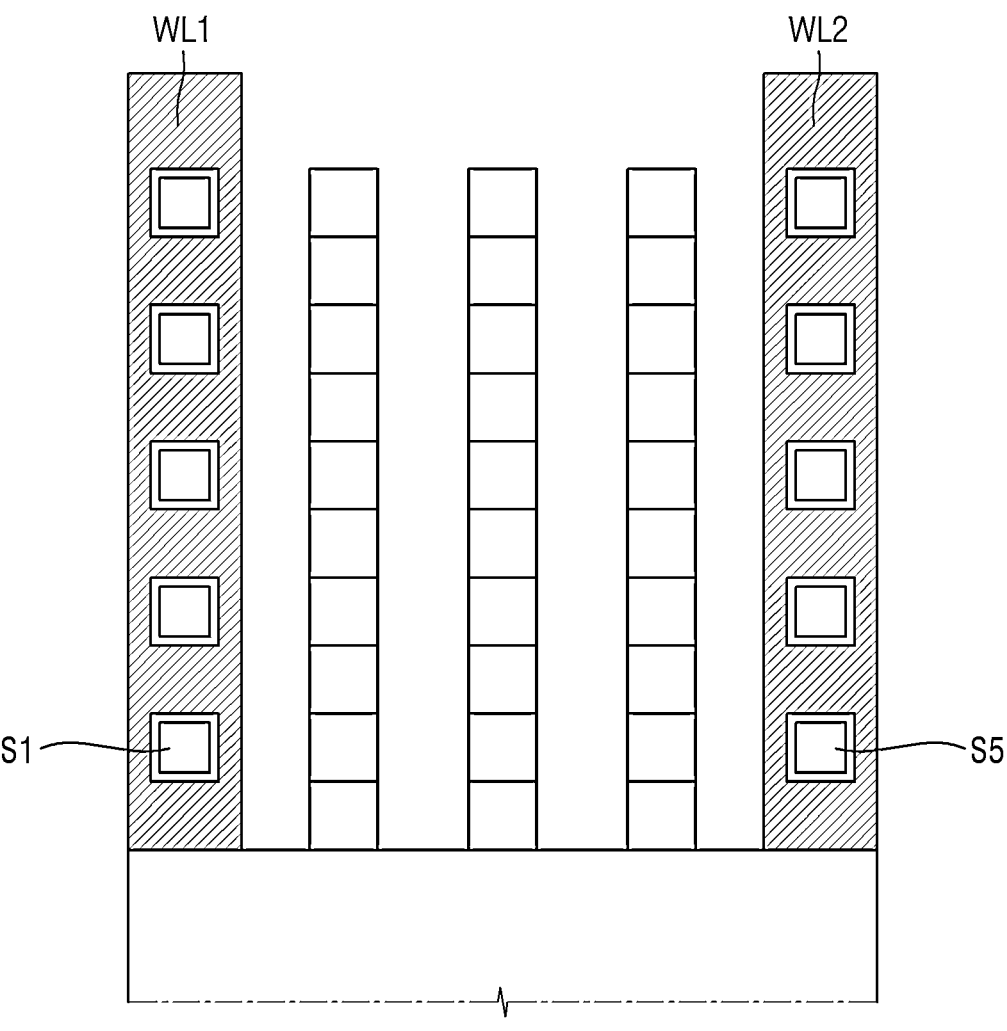

Specifically, referring to FIG. 23, the insulating film 120 is removed, leaving the wordlines WL1 and WL2 in the first switching region SW11.

Figure 24:
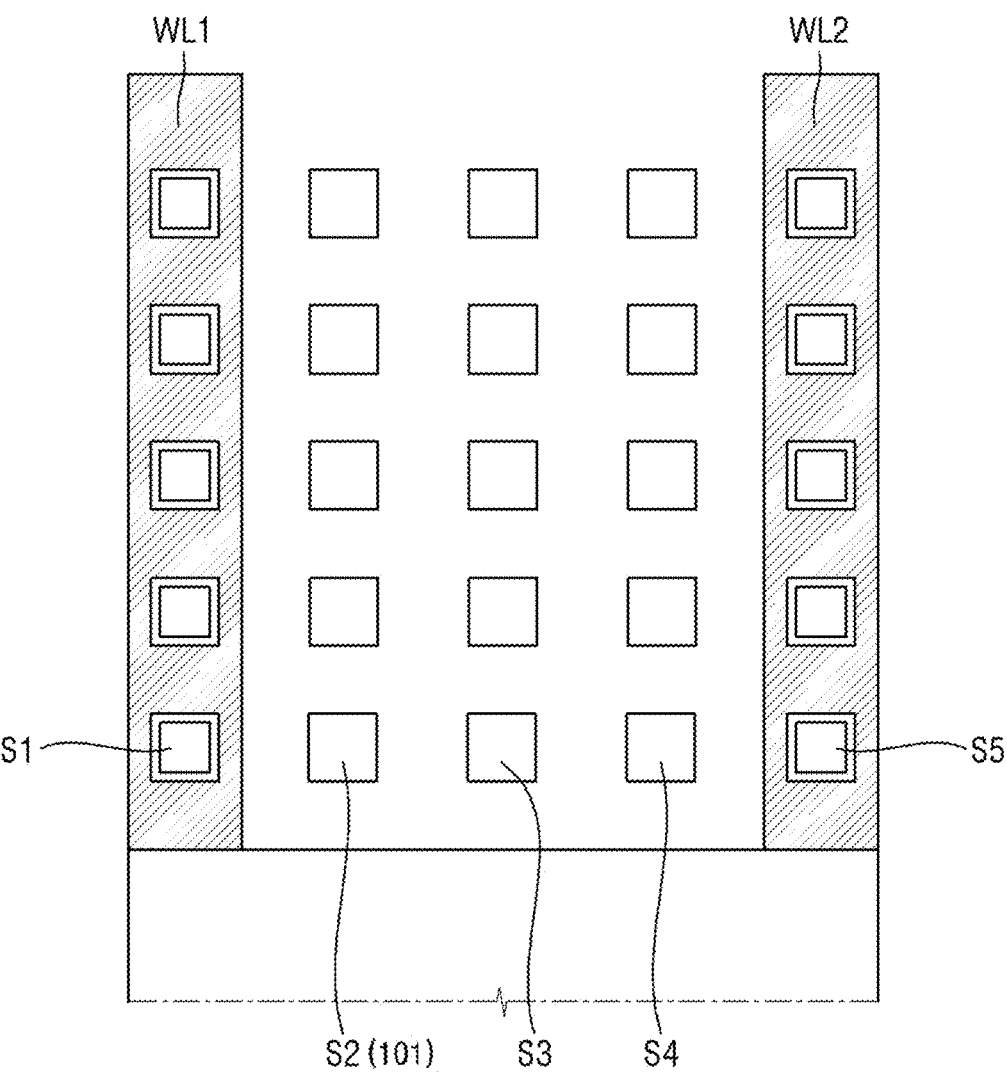

Thereafter, referring to FIG. 24, the second semiconductor layers 102 are removed. The first semiconductor layers 101 remain between the wordlines WL1 and WL2. The remaining first semiconductor layers 101 correspond to the semiconductor patterns S2, S3, and S4 of FIG. 11.

Figure 25:
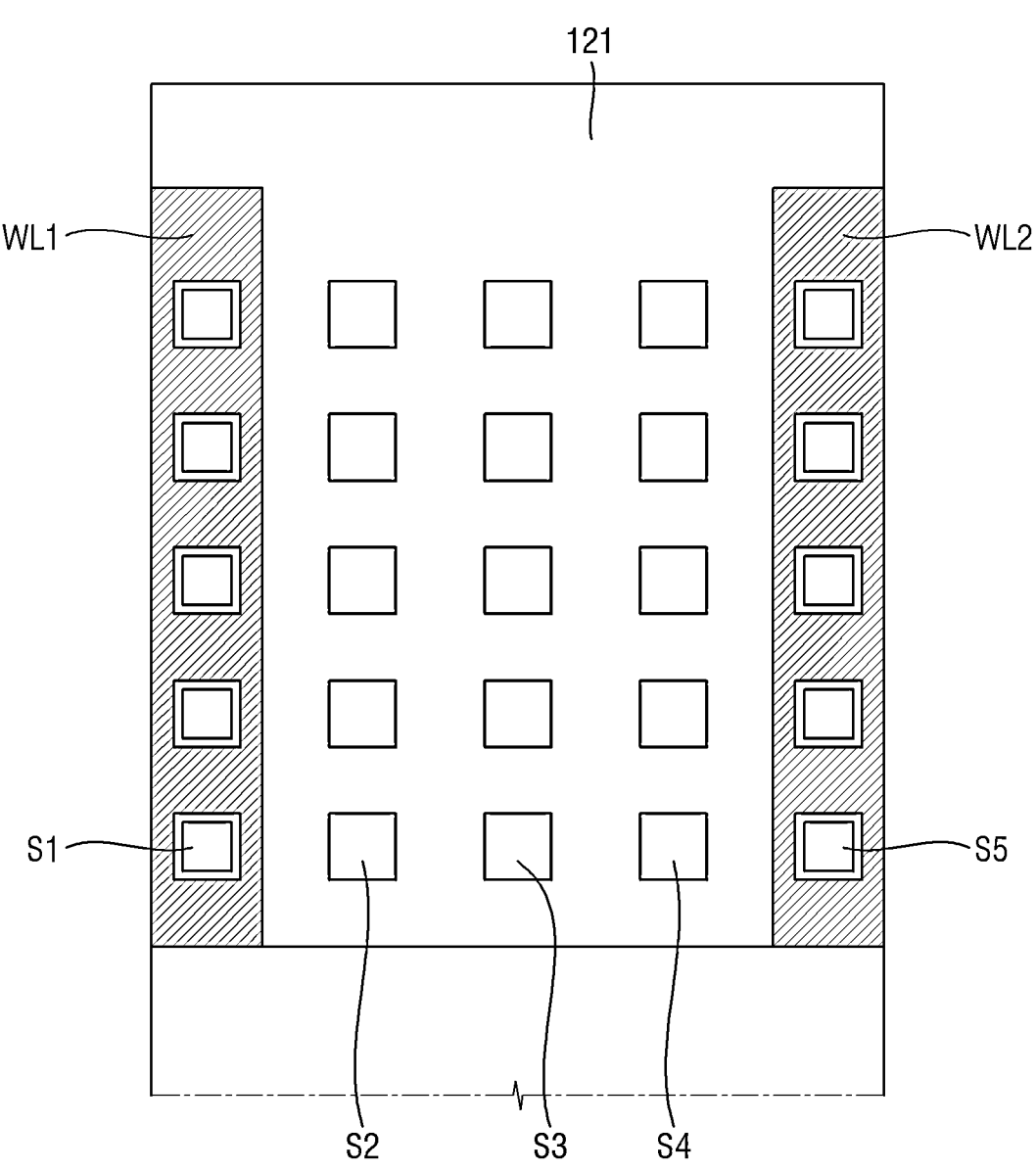

Thereafter, referring to FIG. 25, an insulating film 121 is formed on the structure illustrated in FIG. 24. The insulating film 121 is formed to sufficiently cover semiconductor patterns S2, semiconductor patterns S3, and semiconductor patterns S4.

Figure 26:
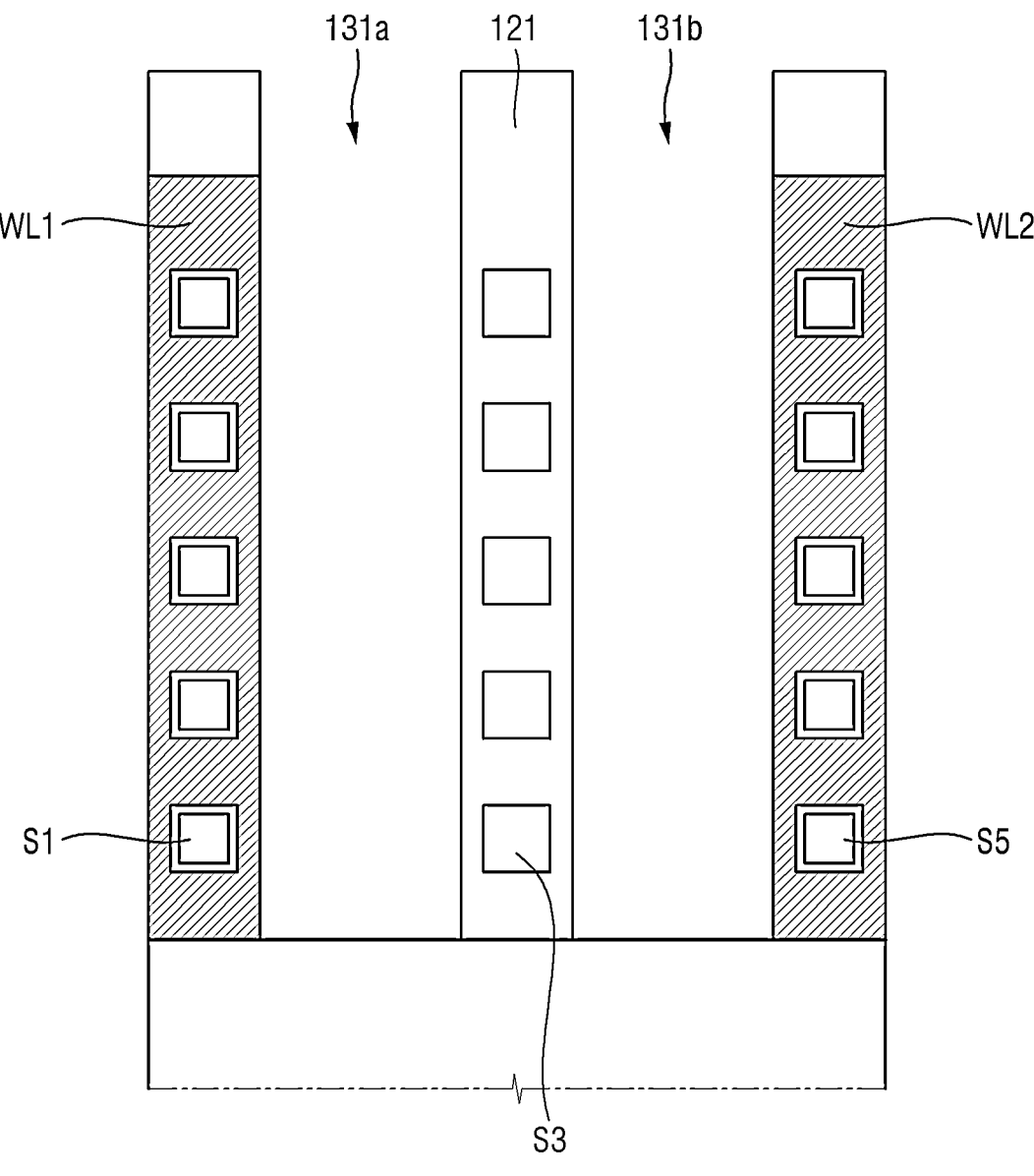

Thereafter, referring to FIG. 26, a mask pattern is formed on the structure illustrated in FIG. 25, and trenches 131a and 131b are formed using the mask pattern. The trenches 131a and 131b are for forming isolation insulating films SAD1 and SAD2. Some of the semiconductor patterns S2 and some of the semiconductor patterns S4 are removed from the first switching region SW11 due to the trenches 131a and 131b.

The trenches 131a and 131b may be formed using a method that does not remove the wordlines WL1 and WL2 or can minimize damage to the wordlines WL1 and WL2. As a result, the trenches 131*a* and 131*b* may be formed to be in contact with the wordlines WL1 and WL2.

Figure 27:
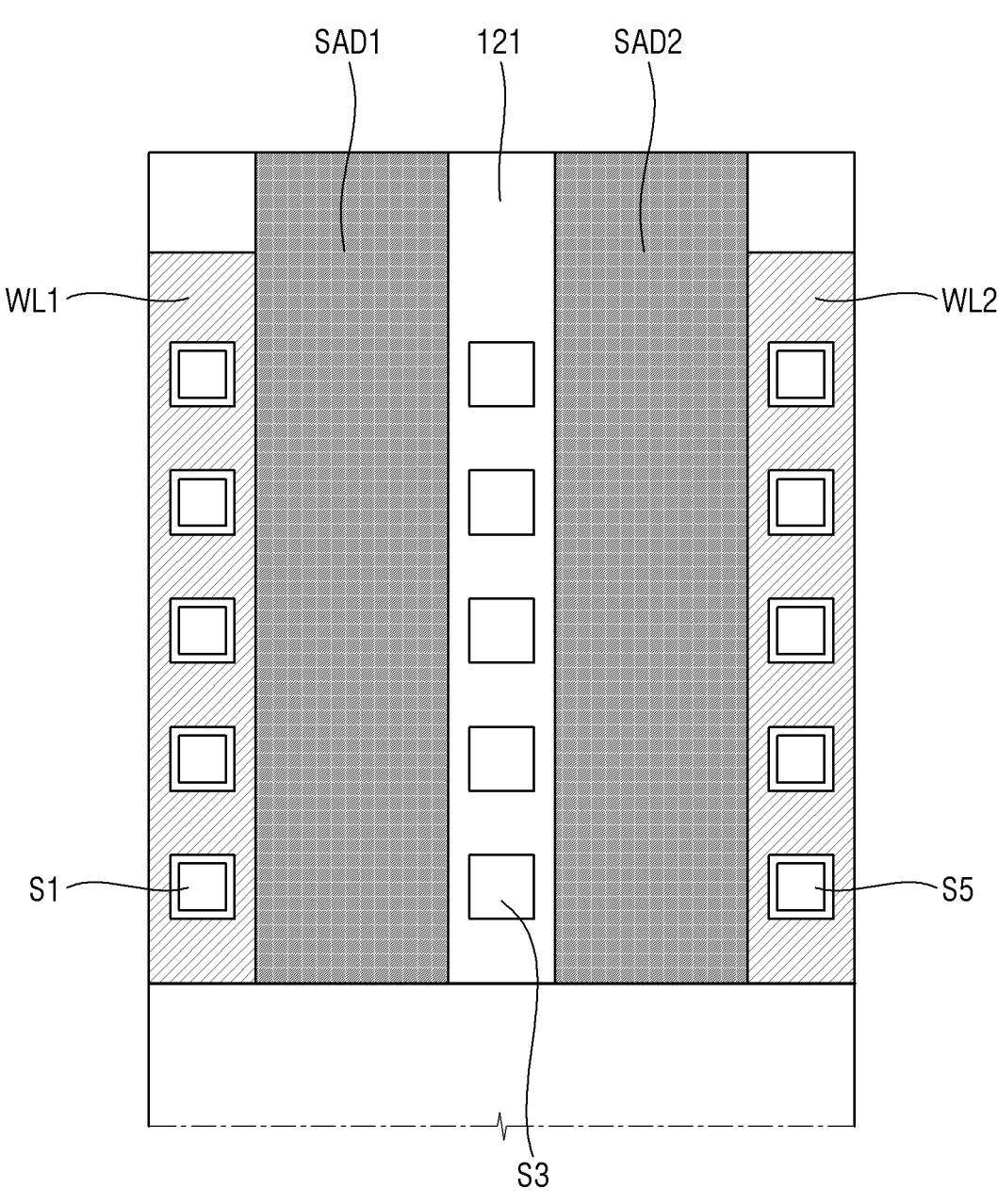

Thereafter, referring to FIG. 27, the isolation insulating films SAD1 and SAD2 are formed by filling the trenches 131*a* and 131*b* with an insulating film. For example, an insulating film may be formed by atomic layer deposition (ALD) to fill the trenches 131*a* and 131*b*. The isolation insulating films SAD1 and SAD2 may be in contact with the wordlines WL1 and WL2 and may be self-aligned.

Thereafter, a planarization process may optionally be performed to remove parts of the insulating film 121 and the isolation insulating films SAD1 and SAD2. As a result, the structure illustrated in FIG. 14 may be obtained.

FIGS. 28 through 32 are cross-sectional views illustrating how to form bitlines of a semiconductor device according to some embodiments of the present disclosure.

Figure 28:
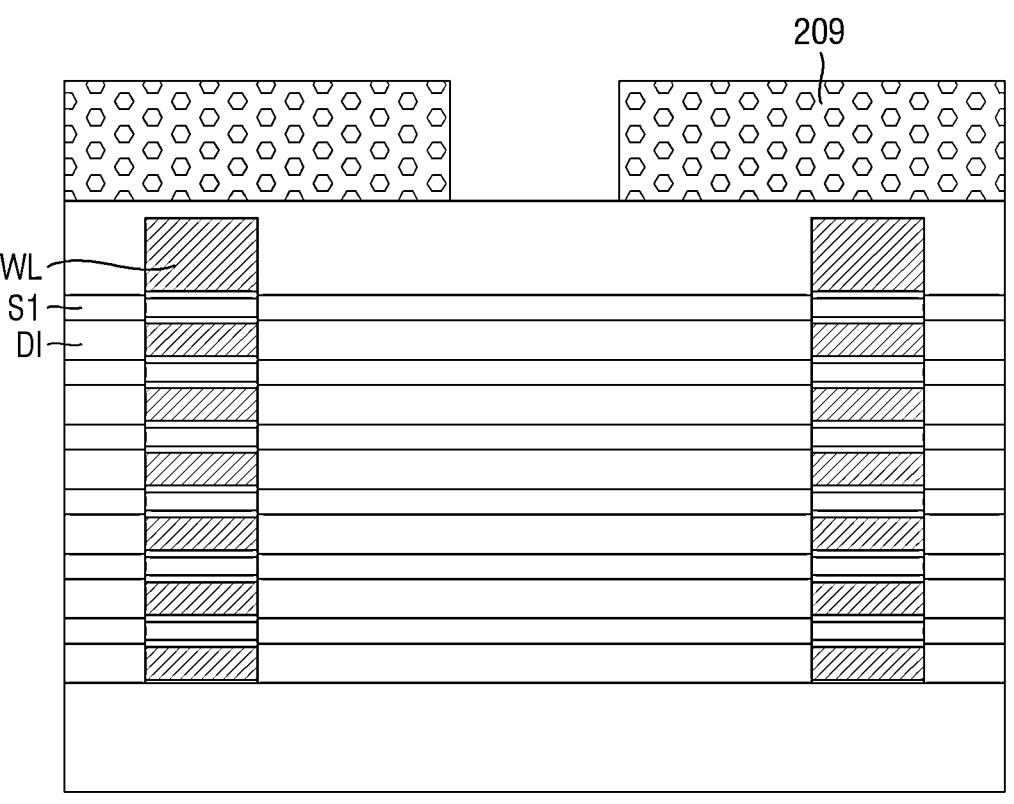
FIGS. 28 through 32 are cross-sectional views illustrating how to form bitlines of a semiconductor device according to some embodiments of the present disclosure.

Referring to FIG. 28, a hard mask 209 is formed on a structure in which a plurality of semiconductor patterns S1 are stacked and wordlines WL are formed. Interlayer insulating films DI are formed between the semiconductor patterns S1. The interlayer insulating films DI may be oxide films.

Figure 29:
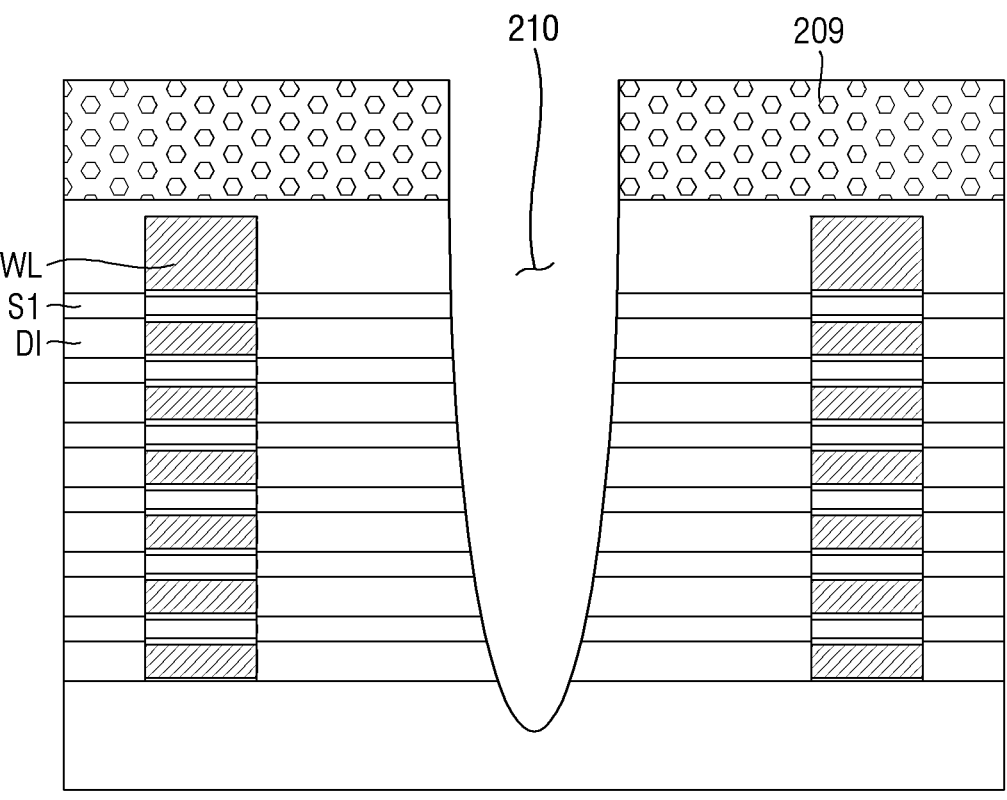

Referring to FIG. 29, a trench 210 is formed in the structure of FIG. 28, using the hard mask 209.

Figure 30:
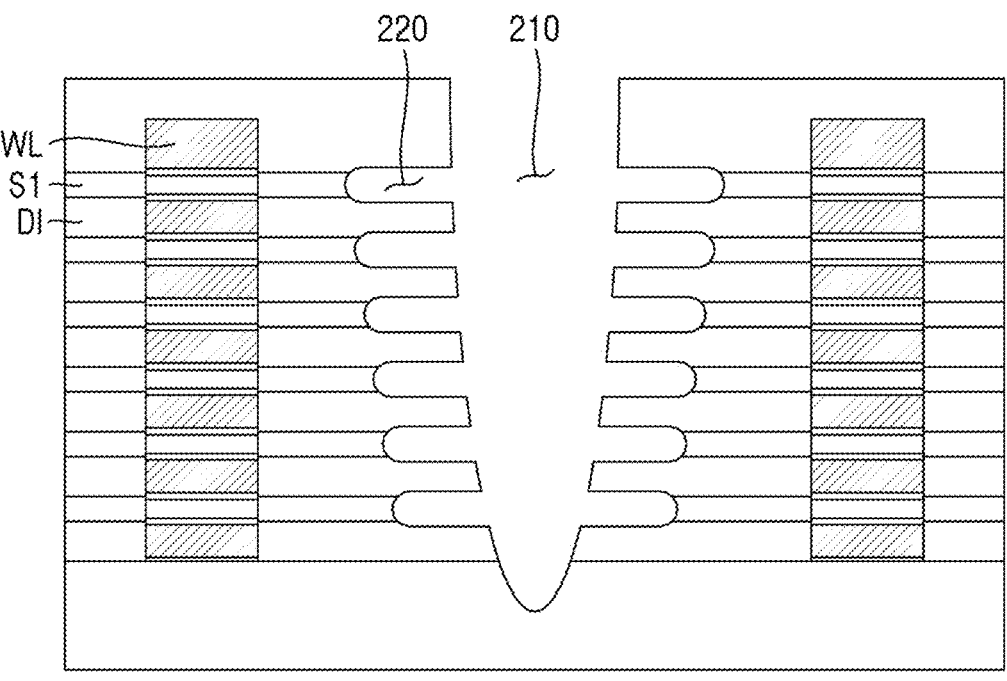

Referring to FIG. 30, bitline forming regions 220 are formed by removing parts of the interlayer insulating films (or oxide films) exposed by the trench 210 via horizontal etching.

Figure 31:
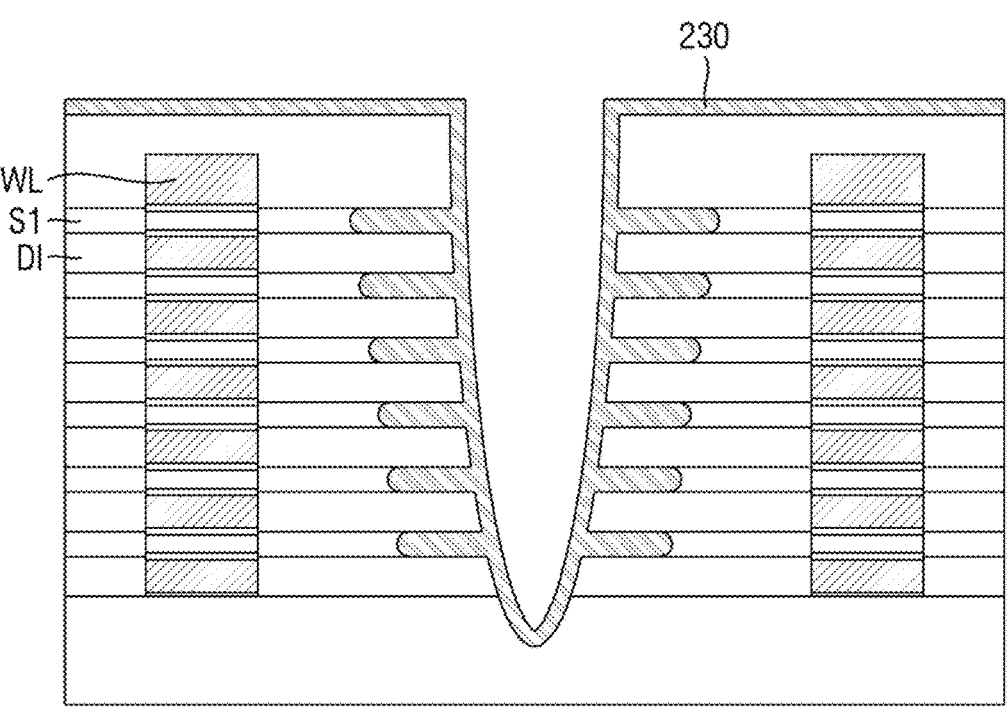

Referring to FIG. 31, the trench 210 and the bitline forming regions 220 are filled with a metal film 230. For example, the metal film 230 may be formed by ALD.

Figure 32:
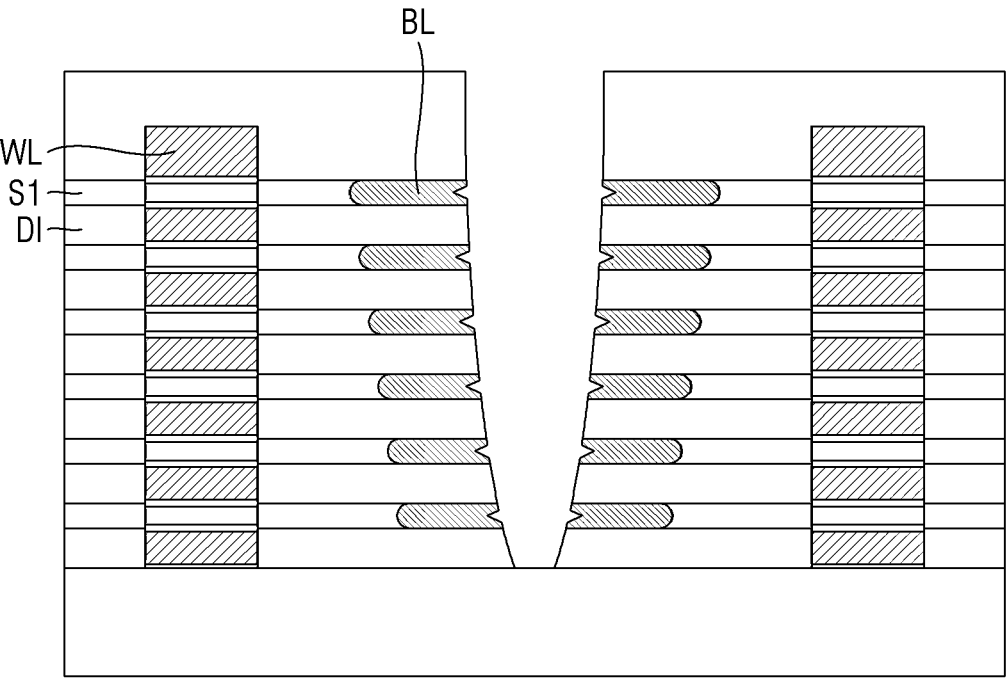

Referring to FIG. 32, the entire metal film 230 except for parts that fill the bitline forming regions 220 is removed. The parts of the metal film 230 that remain in the bitline forming regions 220 correspond to bitlines BL.

Although embodiments of the present invention have been described with reference to the above and the accompanying drawings, it will be appreciated by those of ordinary skill in the art that the present invention can be embodied in other specific forms without departing from its essential character. The embodiments described above should therefore be considered in all respects to be illustrative and not restrictive.

What is claimed is:

1. A semiconductor device comprising:
a stack structure including first and second layers, which are sequentially stacked on a substrate, the first layer including first and second semiconductor patterns, which extend in a first direction and are spaced apart in a second direction different from the first direction, and a first bitline, which extends in the second direction and is electrically connected to the first and second semiconductor patterns, the second layer including third and fourth semiconductor patterns, which extend in the first direction and are spaced apart in the second direction, and a second bitline, which extends in the second direction and is electrically connected to the third and fourth semiconductor patterns, and each of the first through fourth semiconductor patterns including a source, a channel, a drain, and a bottom electrode;
a first wordline connecting the channels of the first and third semiconductor patterns in a vertical direction, the first and third semiconductor patterns being spaced apart from each other in the vertical direction; and
a second wordline connecting the channels of the second and fourth semiconductor patterns in the vertical direction, the second and fourth semiconductor patterns being spaced apart from each other in the vertical direction,
wherein a first distance, in the first direction, between the first bitline and the first wordline differs from a second distance, in the first direction, between the first bitline and the second wordline, and the first wordline and the second wordline are spaced apart in the second direction.

2. The semiconductor device of claim 1, further comprising:
an isolation insulating film disposed between the first and second wordlines to extend in the vertical direction.

3. The semiconductor device of claim 2, wherein the isolation insulating film is in contact with the first and second wordlines and is self-aligned.

4. The semiconductor device of claim 2, further comprising:
an intervening semiconductor pattern extending in the first direction between the first and second semiconductor patterns,
wherein the isolation insulating film is formed to penetrate the intervening semiconductor pattern.

5. The semiconductor device of claim 2, wherein a width, in the first direction, of the isolation insulating film is greater than a width, in the first direction, of the first or second wordline.

6. The semiconductor device of claim 1, wherein
is the source, the channel, and the drain of the first semiconductor pattern are positioned on a first side of the bottom electrode of the first semiconductor pattern, and
the isolation insulating film is positioned on a second side of the bottom electrode of the first semiconductor pattern.

7. The semiconductor device of claim 1, wherein
the first layer further includes a fifth semiconductor pattern, which extends in the first direction,
the first, second, and fifth semiconductor patterns are sequentially arranged,
the second layer further includes a sixth semiconductor pattern, which extends in the first direction,
the third, fourth, and sixth semiconductor patterns are sequentially arranged,
each of the fifth and sixth semiconductor patterns includes a source, a channel, a drain, and a bottom electrode, and
the semiconductor device further comprises a third wordline connecting the channels of the fifth and sixth semiconductor patterns in the vertical direction.

8. The semiconductor device of claim 7, wherein an imaginary line connecting centers of the first and third wordlines does not overlap with the second wordline.

9. The semiconductor device of claim 1, wherein
the first layer further includes a seventh semiconductor pattern, which extends in the first direction between the first and second semiconductor patterns, and a third bitline, which is electrically connected to the seventh semiconductor pattern,
the first bitline is disposed on a first side of the first semiconductor pattern, and
the third bitline is disposed on a second side of the seventh semiconductor pattern.

10. A semiconductor device comprising:
a stack structure including first and second layers, which are sequentially stacked on a substrate, the first layer including first and second semiconductor patterns, which are spaced apart from each other and extend in a first direction, and a first bitline, which extends in a second direction different from the first direction and is electrically connected to the first and second semiconductor patterns, the second layer including third and fourth semiconductor patterns, which are spaced apart from each other and extend in the first direction, and a second bitline, which extends in the second direction and is electrically connected to the third and fourth semiconductor patterns, and each of the first through fourth semiconductor patterns including a source, a channel, a drain, and a bottom electrode;

a first wordline connecting the channels of the first and third semiconductor patterns in a vertical direction;

a second wordline connecting the channels of the second and fourth semiconductor patterns in the vertical direction; and a gate insulating film surrounding four sides of each of the channels of each of the first through fourth semiconductor patterns, on each of the first through fourth semiconductor patterns, wherein a first distance, in the first direction, between the first bitline and the first wordline differs from a second distance, in the first direction, between the first bitline and the second wordline.

11. A semiconductor device comprising:

a stack structure including first and second layers, which are sequentially stacked on a substrate, the first layer including first and second semiconductor patterns, which are spaced apart from each other and extend in a first direction, and a first bitline, which extends in a second direction different from the first direction and is electrically connected to the first and second semiconductor patterns, the second layer including third and fourth semiconductor patterns, which are spaced apart from each other and extend in the first direction, and a second bitline, which extends in the second direction and is electrically connected to the third and fourth semiconductor patterns, and each of the first through fourth semiconductor patterns including a source, a channel, a drain, and a bottom electrode;

a first wordline connecting the channels of the first and third semiconductor patterns in a vertical direction; and a second wordline connecting the channels of the second and fourth semiconductor patterns in the vertical direction, wherein a first distance, in the first direction, between the first bitline and the first wordline differs from a second distance, in the first direction, between the first bitline and the second wordline, wherein the first and second layers are arranged in a stepwise shape so that the first bitline of the first layer includes an exposed region exposed by the second layer, and wherein the semiconductor device further comprises a bitline contact in contact with the exposed region of the first bitline.

* * * * *